(12) United States Patent
Yue et al.

(10) Patent No.: US 12,217,637 B2
(45) Date of Patent: Feb. 4, 2025

(54) DISPLAY BACKPLANE AND PREPARATION METHOD THEREFOR, AND DISPLAY APPARATUS

(71) Applicant: BOE Technology Group Co., Ltd., Beijing (CN)

(72) Inventors: Yang Yue, Beijing (CN); Wei Wang, Beijing (CN); Ruoyu Ma, Beijing (CN); Shunhang Zhang, Beijing (CN); Chuanxiang Xu, Beijing (CN); Xiang Li, Beijing (CN); Yong Yu, Beijing (CN); Shi Shu, Beijing (CN); Qi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/791,226

(22) PCT Filed: Aug. 27, 2021

(86) PCT No.: PCT/CN2021/114996
§ 371 (c)(1),
(2) Date: Mar. 2, 2023

(87) PCT Pub. No.: WO2023/024069
PCT Pub. Date: Mar. 2, 2023

(65) Prior Publication Data
US 2024/0177634 A1 May 30, 2024

(51) Int. Cl.
*G09F 9/33* (2006.01)
*H01L 27/12* (2006.01)
*H01L 27/15* (2006.01)

(52) U.S. Cl.
CPC ............... *G09F 9/33* (2013.01); *H01L 27/12* (2013.01); *H01L 27/15* (2013.01)

(58) Field of Classification Search
CPC ............ G09F 9/33; H01L 27/12; H01L 27/15
See application file for complete search history.

(56) References Cited

U.S. PATENT DOCUMENTS

| | | |
|---|---|---|
| 2021/0043817 A1 | 2/2021 | Liang et al. |
| 2022/0254972 A1 | 8/2022 | Lu et al. |
| 2022/0302234 A1 | 9/2022 | Xue et al. |

FOREIGN PATENT DOCUMENTS

| | | |
|---|---|---|
| CN | 110416248 A | 11/2019 |
| CN | 111524927 A | 8/2020 |

(Continued)

OTHER PUBLICATIONS

English machine translation of Cn 113053924A (Year: 2021).*

*Primary Examiner* — Anne M Hines
(74) *Attorney, Agent, or Firm* — Ling Wu; Stephen Yang; Ling and Yang Intellectual Property

(57) ABSTRACT

The present disclosure provides a display backplane and a preparation method therefor, and a display apparatus. The display backplane includes a plurality of display units, at least one display unit includes a pixel area and a light transmitting area, the pixel area is configured to perform image display and the light transmitting area is configured to transmit light; and in a plane perpendicular to the display backplane, the light transmitting area includes a substrate and a light transmitting structure layer arranged on the substrate, and the light transmitting structure layer is provided with light transmitting holes.

15 Claims, 10 Drawing Sheets

(56) References Cited

FOREIGN PATENT DOCUMENTS

| CN | 212783495 U | 3/2021 |
|---|---|---|
| CN | 113053924 A | 6/2021 |
| KR | 10-2019-0042978 A | 4/2019 |
| KR | 10-2020-0026769 A | 3/2020 |

* cited by examiner

DISPLAY BACKPLANE AND PREPARATION METHOD THEREFOR, AND DISPLAY APPARATUS

CROSS-REFERENCE TO RELATED APPLICATION

The present application is a U.S. National Phase Entry of International Application No. PCT/CN2021/114996 having an international filing date of Aug. 27, 2021. The above-identified application is hereby incorporated by reference.

TECHNICAL FIELD

The present disclosure relates to, but is not limited to, the field of display technology, and in particular to a display backplane and a preparation method therefor, and a display apparatus.

BACKGROUND

Semiconductor Light Emitting Diode (LED) technology has developed for nearly 30 years, from an initial solid-state lighting power supply to a backlight source in the display field, and then to an LED display screen, providing a solid foundation for its wider applications. With the development of chip manufacturing and encapsulation technology, Mini Light Emitting Diode (Mini LED) display and Micro Light Emitting Diode (Micro LED) display have gradually become a hot spot of the display technology. Micro LED display is mainly used in the fields such as AR/VR and Mini LED display is mainly used in the fields such as TV and outdoor display.

At present, LED display is gradually applied to transparent display. Transparent display is an important personalized display field of display technology. It means that a display apparatus itself has a certain degree of light penetration and enables display of images in a transparent state, and a viewer can see not only images in the display apparatus, but also scenes behind the display apparatus. Transparent display may be used for outdoor display or display in open-space public places.

SUMMARY

The following is a summary of subject matter described herein in detail. The summary is not intended to limit the protection scope of the claims.

In one aspect, the present disclosure provides a display backplane, including a plurality of display units, at least one display unit including a pixel area and a light transmitting area, the pixel area being configured to perform image display and the light transmitting area being configured to transmit light; and in a plane perpendicular to the display backplane, the light transmitting area including a substrate and a light transmitting structure layer arranged on the substrate, the light transmitting structure layer being provided with light transmitting holes.

In an exemplary implementation, the light transmitting structure layer includes an inorganic material layer and an organic material layer, and the light transmitting holes provided on the light transmitting structure layer include any one or more of: a through hole penetrating the inorganic material layer and a through hole penetrating the organic material layer.

In an exemplary implementation, the light transmitting structure layer includes: a buffer layer arranged on the substrate, a first passivation layer arranged on a side of the buffer layer away from the substrate, a first planarization layer arranged on a side of the first passivation layer away from the substrate, a second planarization layer arranged on a side of the first planarization layer away from the substrate, a second passivation layer arranged on a side of the second planarization layer away from the substrate, a third passivation layer arranged on a side of the second passivation layer away from the substrate, and a third planarization layer arranged on a side of the third passivation layer away from the substrate; and the light transmitting holes provided on the light transmitting structure layer include any one or more of: a through hole penetrating the buffer layer, a through hole penetrating the first passivation layer, a through hole penetrating the first planarization layer, a through hole penetrating the second planarization layer, a through hole penetrating the second passivation layer, a through hole penetrating the third passivation layer, and a through hole penetrating the third planarization layer.

In an exemplary implementation, the second passivation layer includes a first passivation sublayer and a second passivation sublayer, the second passivation sublayer is arranged on a side of the first passivation sublayer away from the substrate, a material of the first passivation sublayer includes silicon nitride, and a material of the second passivation sublayer includes loose silicon nitride.

In an exemplary implementation, the light transmitting area further includes a protective layer arranged on a side of the light transmitting structure layer away from the substrate, and the protective layer fills the light transmitting holes.

In an exemplary implementation, the light transmitting area further includes an antireflection layer arranged on a side of the protective layer away from the substrate.

In an exemplary implementation, a material of the antireflection layer includes magnesium fluoride.

In an exemplary implementation, a thickness of the antireflection layer is 50 nm to 500 nm.

In an exemplary implementation, the light transmitting area further includes an antireflection layer arranged on a side of the substrate away from the light transmitting structure layer.

In an exemplary implementation, the display backplane includes a display area and a bonding area located on at least one side of the display area, the plurality of display units are located in the display area; in a plane perpendicular to the display backplane, the pixel area includes a substrate and a pixel structure layer arranged on the substrate, the bonding area includes a substrate and a bonding structure layer arranged on the substrate, the pixel structure layer and the bonding structure layer each include an inorganic material layer, a conductive layer and an organic material layer, and a thickness of the organic material layer in the bonding structure layer is smaller than a thickness of the organic material layer in the pixel structure layer.

In an exemplary implementation, the pixel structure layer at least includes: a buffer layer arranged on the substrate, a first conductive layer arranged on a side of the buffer layer away from the substrate and including a first electrode and a second electrode, a first passivation layer arranged on a side of the first conductive layer away from the substrate, a first planarization layer arranged on a side of the first passivation layer away from the substrate, a second planarization layer arranged on a side of the first planarization layer away from the substrate, a second passivation layer arranged on a side of the second planarization layer away from the substrate, and a second conductive layer arranged on a side of the second passivation layer away from the substrate and including a positive connection terminal and a negative connection terminal; and the bonding structure layer at least includes: a buffer layer arranged on the substrate, a first conductive layer arranged on a side of the buffer layer away from the substrate and including a first bonding electrode and a second bonding electrode, a first passivation layer arranged on a side of the first conductive layer away from the substrate, a first planarization layer arranged on a side of the first passivation layer away from the substrate, a second passivation layer arranged on a side of the first planarization layer away from the substrate, and a second conductive layer arranged on a side of the second passivation layer away from the substrate and including a first bonding terminal and a second bonding terminal.

In another aspect, the present disclosure further provides a display apparatus, including the aforementioned display backplane.

In yet another aspect, the present disclosure further provides a method for preparing a display backplane, the display backplane including a plurality of display units, at least one display unit including a pixel area and a light transmitting area, the pixel area being configured to perform image display and the light transmitting area being configured to transmit light; the method including: forming a light transmitting structure layer on the substrate of the light transmitting area, the light transmitting structure layer being provided with light transmitting holes.

In an exemplary implementation, the forming a light transmitting structure layer on the substrate of the light transmitting area includes: forming a light transmitting structure layer including an inorganic material layer and an organic material layer on the substrate of the light transmitting area, and the light transmitting holes provided on the light transmitting structure layer include any one or more of: a through hole penetrating the inorganic material layer and a through hole penetrating the organic material layer.

In an exemplary implementation, the forming a light transmitting structure layer on the substrate of the light transmitting area includes: forming a buffer layer on the substrate, forming a first passivation layer on the buffer layer, forming a first planarization layer on the first passivation layer, forming a second planarization layer on the first planarization layer, forming a second passivation layer on the second planarization layer, forming a third passivation layer on the second passivation layer, and forming a third planarization layer on the third passivation layer; and the light transmitting holes provided on the light transmitting structure layer include any one or more of: a through hole penetrating the buffer layer, a through hole penetrating the first passivation layer, a through hole penetrating the first planarization layer, a through hole penetrating the second planarization layer, a through hole penetrating the second passivation layer, a through hole penetrating the third passivation layer, and a through hole penetrating the third planarization layer.

Other aspects will become apparent upon reading and understanding the accompanying drawings and the detailed description.

BRIEF DESCRIPTION OF DRAWINGS

Accompanying drawings are used for providing an understanding for technical solutions of the present application and form a part of the specification, are used for explaining the technical solutions of the present application together with embodiments of the present application, and do not constitute a limitation on the technical solutions of the present application.

DESCRIPTION OF REFERENCE SIGNS

Figure 1:
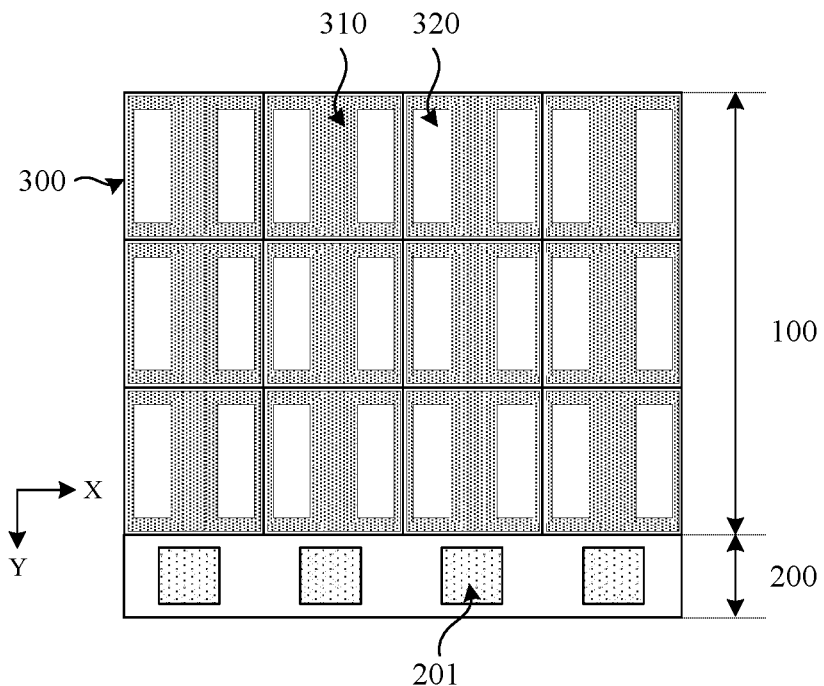
FIG. 1 is a schematic diagram of a planar structure of a display backplane according to an exemplary embodiment of the present disclosure.

10—substrate; 11—buffer layer; 12—first passivation layer; 13—first planarization layer; 14—second planarization layer; 15—second passivation layer; 16—third passivation layer; 17—black matrix; 18—third planarization layer; 19—protective layer; 20—antireflection layer; 31—first electrode; 32—second electrode; 33—positive connection terminal; 34—negative connection terminal; 41—first bonding electrode; 42—second bonding electrode; 50—light emitting diode; 51—luminous body; 52—positive pin; 53—negative pin; 43—first bonding terminal; 44—second bonding terminal; 100—display area; 200—bonding area; 201—pad area; 300—display unit; 310—pixel area; and 320—light transmitting area.

DETAILED DESCRIPTION

To make objectives, technical solutions, and advantages of the present disclosure clearer, the embodiments of the present disclosure will be described in detail with reference to the accompanying drawings. It is to be noted that implementation modes may be carried out in a number of different forms. Those of ordinary skills in the art may readily understand the fact that implementations and contents may be transformed into a variety of forms without departing from the spirit and scope of the present disclosure. Therefore, the present disclosure should not be construed as being limited only to what is described in the following implementation modes. The embodiments in the present disclosure and the features in the embodiments may be combined with each other arbitrarily if there is no conflict.

In the drawings, a size of each constituent element, and a thickness of a layer or a region are exaggerated sometimes for clarity. Therefore, one mode of the present disclosure is not necessarily limited to the size, and shapes and sizes of various components in the drawings do not reflect true scale. In addition, the drawings schematically illustrate ideal examples, and one mode of the present disclosure is not limited to the shapes, numerical values, or the like shown in the drawings.

Ordinal numerals such as "first", "second", and "third" in the specification are set to avoid confusion of constituent elements, but not to set a limit in quantity.

In the specification, for convenience, wordings indicating orientation or positional relationships, such as "center", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to directions according to which the constituent elements are described. Therefore, appropriate replacements can be made according to situations without being limited to the wordings described in the specification.

In the specification, unless otherwise specified and defined explicitly, terms "mount", "mutually connect", and "connect" should be understood in a broad sense, which, for example, may be a fixed connection, or a detachable connection, or an integrated connection; may be a mechanical connection or an electrical connection; may be a direct mutual connection, or an indirect connection through an intermediary, or internal communication between two elements. Those of ordinary skills in the art may understand specific meanings of these terms in the present disclosure according to specific situations.

In the specification, a transistor refers to an element that at least includes three terminals, i.e., a gate electrode, a drain electrode and a source electrode. The transistor has a channel region between the drain electrode (drain electrode terminal, drain region, or drain electrode) and the source electrode (source electrode terminal, source region, or source electrode), and a current may flow through the drain electrode, the channel region, and the source region. It is to be noted that in the specification, the channel region refers to a region that a current mainly flows through.

In the specification, a first electrode may be a drain electrode and a second electrode may be a source electrode; or, a first electrode may be a source electrode and a second electrode may be a drain electrode. In cases that transistors with opposite polarities are used, or a direction of a current changes during work of a circuit, or the like, functions of the "source electrode" and the "drain electrode" may sometimes be exchanged. Therefore, the "source electrode" and the "drain electrode" may be exchanged in the specification.

In the specification, an "electric connection" includes a case where constituent elements are connected together through an element having a certain electric function. There is no specific restriction on the "element having a certain electrical function" as long as it allows transmitting and receiving of electrical signals between connected constituent elements. Examples of the "element having a certain electric function" include not only an electrode and a wiring, but also a switching element such as a transistor, a resistor, an inductor, a capacitor, and other elements having various functions, etc.

In the specification, "parallel" refers to a state in which an angle formed by two straight lines is $-10°$ or more and $10°$ or less, and thus also includes a state in which the angle is $-5°$ or more and $5°$ or less. In addition, "perpendicular" refers to a state in which an angle formed by two straight lines is $80°$ or more and $100°$ or less, and thus also includes a state in which the angle is $85°$ or more and $95°$ or less.

In the specification, a "film" and a "layer" are interchangeable. For example, a "conductive layer" may be replaced with a "conductive film" sometimes. Similarly, an "insulating film" may be replaced with an "insulating layer" sometimes.

In the present disclosure, "about" refers to that a boundary is defined not so strictly and numerical values within process and measurement error ranges are allowed.

At present, although the display market is dominated by Liquid Crystal Display (LCD) and Organic Light Emitting Diode (OLED) display, due to the limitations in substrate size, preparation devices, process, etc., it is difficult for LCD and OLED to implement large-size display. In contrast, Micro LED/Mini LED display may implement large-size display by splicing, which can break the size limitation.

Generally, a large-size LED display panel is formed by using horizontal beam or vertical beam to fix a plurality of boxes in which LED display backplanes are arranged, the plurality of boxes splicing the plurality of LED display backplanes to form the large-size LED display panel. Because LEDs have the advantages of self-luminescence, wide viewing angle, fast response, simple structure, small volume, lightness and thinness, energy saving, high efficiency, long service life, clear light, etc., a large-size LED display panel can achieve high resolution (such as Pixels Per Inch, PPI).

An LED display backplane is prepared by miniaturization, arraying and filming using miniaturization process technology. Generally, a typical dimension (e.g., length) of a Micro LED may be less than 50 μm, e.g., 10 μm to 50 μm. A typical dimension (e.g., length) of a Mini LED may be about 50 μm to 150 μm, e.g., 80 μm to 120 μm. By transferring LEDs to the display backplane in batches, in cooperation with the driving design, each LED is addressable and can be individually driven to light up.

FIG. 1 is a schematic diagram of a planar structure of a display backplane according to an exemplary embodiment of the present disclosure. As shown in FIG. 1, in an exemplary implementation, the display backplane may include a display area 100 and a bonding area 200. The display area 100 is configured to perform transparent display, and the bonding area 200 may be located on at least one side of the display area 100 and is configured to be bonded to a Flexible Printed Circuit (FPC).

In an exemplary implementation, the display area 100 may include a plurality of regularly arranged display units 300. At least one display unit 300 may include a pixel area 310 and a light transmitting area 320. A drive circuit and at least one light emitting diode are arranged in the pixel area 310. The light emitting diode is connected to the drive circuit. The pixel area 310 is configured to perform image display. The light transmitting area 320 is located in an area outside the pixel area 310 in the display unit 300. The light transmitting area 320 is configured to transmit light, so that the display unit 300 can achieve image display in a transparent state, i.e., transparent display.

In an exemplary implementation, in the display unit 300, an area of the pixel area 310 may be larger than an area of the light transmitting area 320, or the area of the pixel area 310 may be smaller than the area of the light transmitting area 320, or the area of the pixel area 310 may be equal to the area of the light transmitting area 320, which is not limited here in the present disclosure. Generally, the larger the area of the light transmitting area 320, the greater the transmittance of the display unit 300, the greater the transmittance of the display backplane, and the clearer the image seen through the display backplane.

In an exemplary implementation, the bonding area 200 may be located on a side of the display area 100 in a second direction Y, the bonding area 200 may at least include a plurality of bonding pad areas 201, the plurality of bonding pad areas 201 may be arranged sequentially in a first direction X, each bonding pad area 201 may be provided with at least one bonding terminal, and the bonding terminal is connected to the drive circuit in the display unit through a lead, the first direction X intersecting the second direction Y. In an exemplary implementation, the bonding terminal is configured to be bonding-connected to a flexible printed circuit and connected to an external circuit through the flexible printed circuit.

Figure 2:
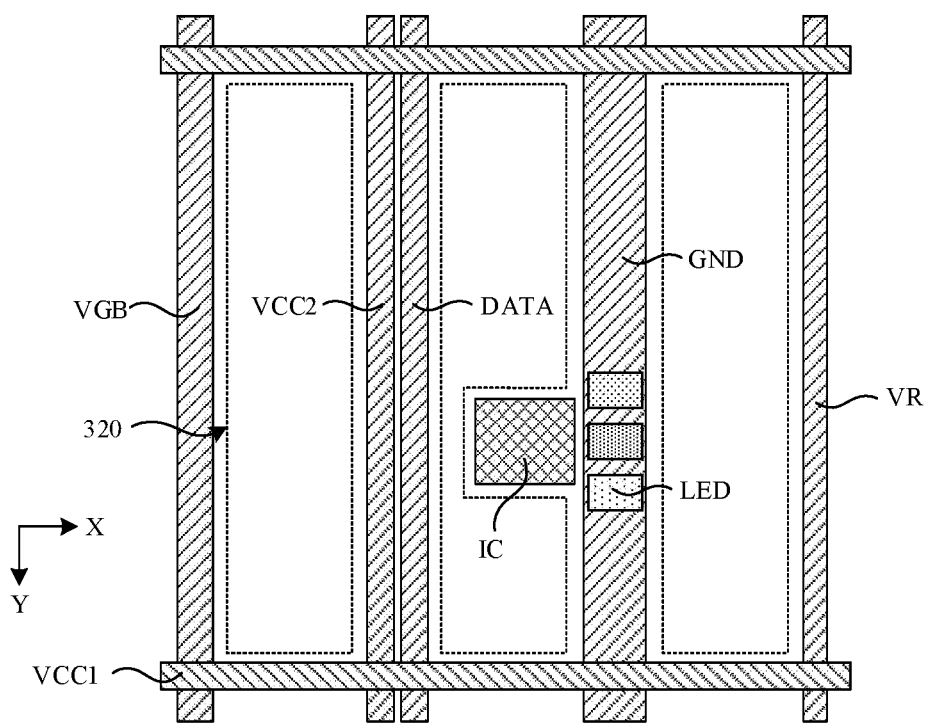
FIG. 2 is a schematic diagram of a planar structure of a display unit according to an exemplary embodiment of the present disclosure.

FIG. 2 is a schematic diagram of a planar structure of a display unit according to an exemplary embodiment of the present disclosure. As shown in FIG. 2, in an exemplary implementation, the pixel area of at least one display unit may include a drive circuit and a light emitting diode group. The drive circuit may include a plurality of signal lines and a pixel drive chip IC. The light emitting diode group may include three light emitting diodes, e.g., a red LED which emits red light, a blue LED which emits blue light, and a green LED which emits green light.

In an exemplary implementation, the plurality of signal lines may include a first scan line VCC1, an adapter line VCC2, a data signal line DATA, a ground line GND, a first drive line VGB, and a second drive line VR. The first scan line VCC1 may extend in the first direction X, and the adapter line VCC2, the data signal line DATA, the ground line GND, the first drive line VGB and the second drive line VR may extend in the second direction Y.

In an exemplary implementation, the first scan line VCC1 may be located on a side of the second direction Y in the display unit, the first drive line VGB may be located on a side of an opposite direction of the first direction X in the display unit, and the second drive line VR may be located on a side of the first direction X in the display unit. In an exemplary implementation, it may be considered that two first scan lines VCC1 define a display unit row, the first drive line VGB and the second drive line VR define a display unit column, and two first scan lines VCC1 intersect with the first drive line VGB and the second drive line VR, thereby defining a display unit.

In an exemplary implementation, the adapter line VCC2 may be located between the first drive line VGB and the second drive line VR, and the adapter line VCC2 may be connected to the first scan line VCC1 through a via hole. The first scan line VCC1 is configured to provide a scan signal. Because a chip terminal bonded to the pixel drive chip IC is located on a side edge of the display unit in the second direction Y, the adapter line VCC2 is configured to turn the first scan line VCC1 extending in the first direction X to the second direction Y to facilitate connection with the chip terminal.

In an exemplary implementation, the first drive line VGB may be connected to the blue LED and the green LED respectively, and configured to provide a drive signal to the blue LED and the green LED respectively; and the second drive line VR may be connected to the red LED and configured to provide a drive signal to the red LED. Because the luminous characteristics of the blue LED and the green LED are substantially the same, while the luminous characteristics of the red LED and the blue/green LED are different, the blue LED and the green LED may be driven by a single first drive line VGB, while the red LED needs to be driven by a separate second drive line VR. In an exemplary implementation, the blue LED and the green LED may each be connected to a drive line, which is not limited here in the present disclosure.

In an exemplary implementation, the data signal line DATA and the ground line GND may be located between the first drive line VGB and the second drive line VR, the pixel drive chip IC may be located between the data signal line DATA and the ground line GND, the data signal line DATA is configured to provide a data signal to the pixel drive chip IC, the ground line GND is configured to provide a ground signal, and the pixel drive chip IC is configured to control the red LED, the blue LED and the green LED to be turned on, according to a data signal provided by the data signal line DATA under the control of the first scan line VCC1 and the adapter line VCC2.

In an exemplary implementation, the red LED, the blue LED and the green LED may be arranged sequentially in the second direction Y, the three LEDs may be arranged in an area where the ground line GND is located, and orthographic projections of the three light emitting diodes on a display backplane plane overlaps at least partially with an orthographic projection of the ground line GND on the display backplane plane, thereby improving the light emitting quality of the light emitting diodes.

In an exemplary implementation, the light emitting diode LED includes two pins (a positive pin and a negative pin), and correspondingly, connection terminals in one-to-one correspondence with the LED pins are provided in the display unit. In an exemplary implementation, the connection terminals in the display unit may include: a red positive connection terminal R+ configured to be connected to a positive pin of the red LED, a red negative connection terminal R− configured to be connected to a negative pin of the red LED, a blue positive connection terminal B+ configured to be connected to a positive pin of the blue LED, a blue negative connection terminal B− configured to be connected to a negative pin of the blue LED, a green positive connection terminal G+ configured to be connected to a positive pin of the green LED, and a green negative connection terminal G− configured to be connected to a negative pin of the green LED. In an exemplary implementation, the red positive connection terminal R+ may be connected to the second drive line VR, the blue positive connection terminal B+ may be connected to the first drive line VGB, and the green positive connection terminal G+ may be connected to the first drive line VGB.

In an exemplary implementation, the pixel drive chip IC may include six chip pins, and correspondingly, chip terminals in one-to-one correspondence with the chip pins are provided in the display unit, which are respectively a first chip terminal, a second chip terminal, a third chip terminal, a fourth chip terminal, a fifth chip terminal and a sixth chip terminal. In an exemplary implementation, the first chip terminal may be connected to the red negative connection terminal R−, the second chip terminal may be connected to the blue negative connection terminal B−, the third chip terminal may be connected to the green negative connection terminal G−, the fourth chip terminal may be connected to the adapter line VCC2, the fifth chip terminal may be connected to the data signal line DATA, and the sixth chip terminal may be connected to the ground line GND.

In an exemplary implementation, the adapter line VCC2, the data signal line DATA, the ground line GND, the first drive line VGB and the second drive line VR extending in the second direction Y may be arranged in a same layer in the first conductive layer and formed simultaneously by a single process; and a plurality of connection terminals connected to the light emitting diodes, a plurality of chip terminals connected to the pixel drive chip IC and the first scan line VCC1 extending in the first direction X may be arranged in a same layer in the second conductive layer and formed simultaneously by a single process. The aforementioned connection may be direct connection or connection through a via hole.

In an exemplary implementation, a plurality of bonding terminals in the bonding area may be arranged in the second conductive layer, arranged in a same layer as a plurality of connection terminals and a plurality of chip terminals of the display unit, and formed simultaneously by a single process.

In an exemplary implementation, the display unit may include a pattern of a black matrix (BM), the pattern of the black matrix may be located in an area where the drive circuit and the light emitting diode group are located, and an orthographic projection of the black matrix on the display backplane plane overlaps at least partially with orthographic projections of the drive circuit and the light emitting diode group on the display backplane plane.

In an exemplary implementation, the orthographic projection of the black matrix on the display backplane plane includes the orthographic projections of the drive circuit and the light emitting diode group on the display backplane plane, to reduce the visibility of the plurality of signal lines and improve the display quality of the display backplane.

In an exemplary implementation, the pattern of the black matrix (the area where the drive circuit and the light emitting diode group are located) in the display unit forms the pixel area, which is an opaque area, and an area outside the pattern of the black matrix is the light transmitting area 320. In FIG. 2, an area indicated by a dashed frame is the light transmitting area 320, and an area outside the dashed frame is the pattern of the black matrix.

In an exemplary implementation, there may be a plurality of light emitting diodes in the light emitting diode group in the display unit, e.g., 4, 5, 6, 8, etc., and the arrangement mode of the plurality of light emitting diodes may be set according to an actual situation, which will not be limited here in the present disclosure.

In an exemplary implementation, a first width of the first drive line VGB is about 60 µm to 80 µm, for example, may be about 70 µm. A first width of the second drive line VR may be about 20 µm to 40 µm, for example, may be about 30 µm. A first width of the ground line GND may be about 180 µm to 200 µm, for example, may be about 190 µm. A first width of the data signal line DATA may be about 10 µm to 30 µm, for example, may be about 20 µm. A first width of the adapter line VCC2 may be about 20 µm to 40 µm, for example, may be about 30 µm. The first width is a dimension in the first direction X.

In an exemplary implementation, a second width of the first scan line VCC1 may be about 60 µm to 80 µm, for example, may be about 70 µm. The second width is a dimension in the second direction Y.

In an exemplary implementation, first spacing between the first drive line VGB and the second drive line VR may be about 35 µm to 55 µm, for example, may be about 45 µm. First spacing between the data signal line DATA and the adapter line VCC2 may be about 35 µm to 55 µm, for example, may be about 45 µm. First spacing between the second drive line VR and the ground line GND may be about 600 µm to 800 µm, for example, may be about 690 µm. First spacing between the ground line GND and the data signal line DATA may be about 600 µm to 800 µm, for example, may be about 690 µm. First spacing between the adapter line VCC2 and the first drive line VGB may be about 600 µm to 800 µm, for example, may be about 690 µm. First spacing between the light emitting diode (LED) and the pixel drive chip IC may be about 100µ to 140 µm, for example, may be about 120 µm. The first spacing is a dimension in the first direction X.

In an exemplary implementation, among the three light emitting diodes (LEDs) arranged sequentially in the second direction Y, second spacing between adjacent light emitting diodes (LEDs) may be about 80 µm to 120 µm, for example, may be about 100 µm. The second spacing is a dimension in the second direction Y.

Figure 3:
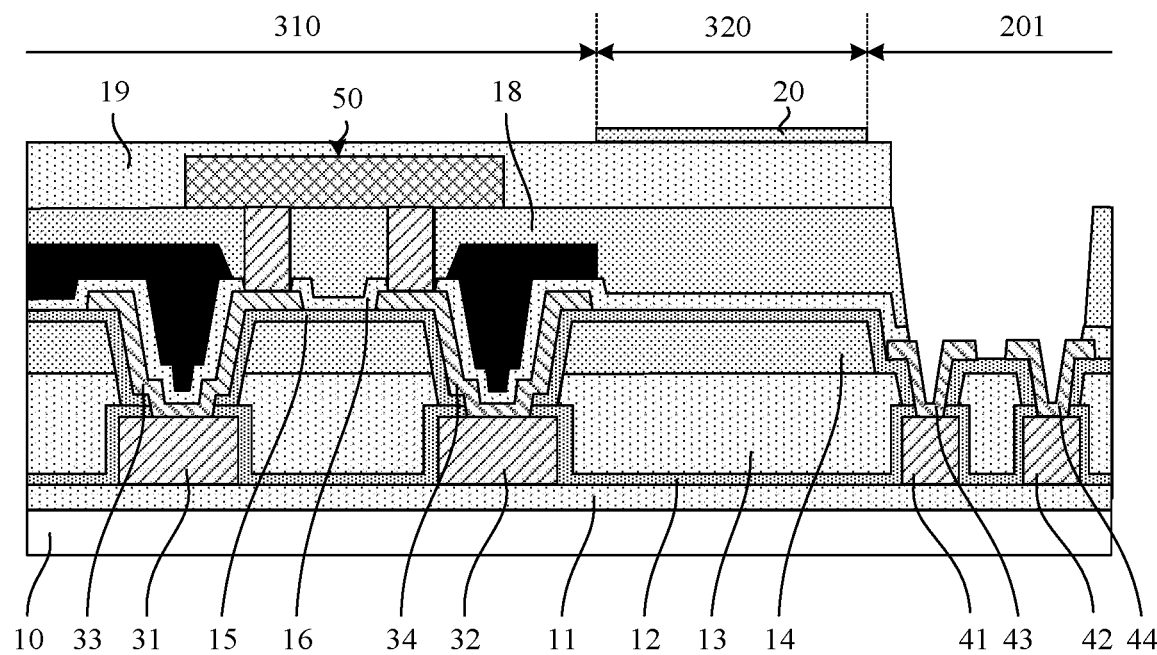
FIG. 3 is a schematic diagram of a sectional structure of a display backplane according to an exemplary embodiment of the present disclosure.

FIG. 3 is a schematic diagram of a sectional structure of a display backplane according to an exemplary embodiment of the present disclosure, illustrating sectional structures of a pixel area 310 and a light transmitting area 320 in a display area and a bonding pad area 201 in a bonding area 200. As shown in FIG. 3, in an exemplary implementation, the pixel area 310 of the display backplane may include a substrate 10, a pixel structure layer arranged on the substrate 10, and a protective layer 19 arranged on a side of the pixel structure layer away from the substrate; the light transmitting area 320 of the display backplane may include a substrate 10, a light transmitting structure layer arranged on the substrate 10, a protective layer 19 arranged on a side of the light transmitting structure layer away from the substrate, and an antireflection layer 20 arranged on a side of the protective layer 19 away from the substrate; and the bonding pad area 201 of the display backplane may include a substrate 10 and a bonding structure layer arranged on the substrate 10.

In an exemplary implementation, the pixel structure layer of the pixel area 310 may include: a buffer layer 11 arranged on the substrate 10, a first conductive layer arranged on a side of the buffer layer 11 away from the substrate, the first conductive layer at least including a first electrode 31 and a second electrode 32, a first passivation layer 12 arranged on a side of the first conductive layer away from the substrate, a first planarization layer 13 arranged on a side of the first passivation layer 12 away from the substrate, a second planarization layer 14 arranged on a side of the first planarization layer 13 away from the substrate, a second passivation layer 15 arranged on a side of the second planarization layer 14 away from the substrate, a second conductive layer arranged on a side of the second passivation layer 15 away from the substrate, the second conductive layer at least including a positive connection terminal 33 and a negative connection terminal 34, the positive connection terminal 33 being connected to the first electrode 31 through a via hole and the negative connection terminal 34 being connected to the second electrode 32 through a via hole, a third passivation layer 16 arranged on a side of the second conductive layer away from the substrate, a third planarization layer 18 arranged on a side of the third passivation layer 16 away from the substrate, and a light emitting diode 50 arranged on a side of the third planarization layer 18 away from the substrate, the light emitting diode 50 being respectively connected to the positive connection terminal 33 and the negative connection terminal 34.

In an exemplary implementation, the protective layer 19 may be arranged on a side of the light emitting diode 50 away from the substrate. The pixel structure layer of the pixel area 310 may further include a black matrix arranged on a side of the third passivation layer 16 away from the substrate.

In an exemplary implementation, the light transmitting structure layer of the light transmitting area 320 may include: a buffer layer 11 arranged on the substrate 10, a first passivation layer 12 arranged on a side of the buffer layer 11 away from the substrate, a first planarization layer 13 arranged on a side of the first passivation layer 12 away from the substrate, a second planarization layer 14 arranged on a side of the first planarization layer 13 away from the substrate, a second passivation layer 15 arranged on a side of the second planarization layer 14 away from the substrate, a third passivation layer 16 arranged on a side of the second passivation layer 15 away from the substrate, and a third planarization layer 18 arranged on a side of the third passivation layer 16 away from the substrate.

In an exemplary implementation, the protective layer 19 may be arranged on a side of the third planarization layer 18 away from the substrate, and the antireflection layer 20 may be arranged on a side of the protective layer 19 away from the substrate.

In an exemplary implementation, the plurality of film layers in the light transmitting area will cause light to be reflected at interfaces of the plurality of film layers, resulting in a phase difference in emitted light, leading to a reduction in light transmittance at certain wavelengths; and the antireflection layer 20 is configured so that light that would otherwise be reflected passes through an antireflection film and then becomes coherent to cancel out, thereby allowing all light in the corresponding wavelengths to pass through the light transmitting area 320, increasing the transmittance of the light transmitting area 320.

In an exemplary implementation, the bonding structure layer of the bonding pad area 201 may include: a buffer layer 11 arranged on the substrate 10, a first conductive layer arranged on a side of the buffer layer 11 away from the substrate, the first conductive layer at least including a first bonding electrode 41 and a second bonding electrode 42, a first passivation layer 12 arranged on a side of the first conductive layer away from the substrate, a first planarization layer 13 arranged on a side of the first passivation layer 12 away from the substrate, a second passivation layer 15 arranged on a side of the first planarization layer 13 away from the substrate, a second conductive layer arranged on a side of the second passivation layer 15 away from the substrate, the second conductive layer at least including a first bonding terminal 43 and a second bonding terminal 44, the first bonding terminal 43 being connected to the first bonding electrode 41 through a via hole and the second bonding terminal 44 being connected to the second bonding electrode 42 through a via hole, and a third passivation layer 16 arranged on a side of the second conductive layer away from the substrate, the third passivation layer 16 being provided with bonding via holes exposing the first bonding terminal 43 and the second bonding terminal 44.

In an exemplary implementation, the bonding structure layer may include a third planarization layer 18 arranged on a side of the third passivation layer 16 away from the substrate, the third planarization layer 18 being provided with bonding via holes exposing the first bonding terminal 43 and the second bonding terminal 44.

In an exemplary implementation, in the pixel area 310, the first planarization layer 13, the second planarization layer 14 and the third planarization layer 18 in the pixel structure layer may form an organic material layer; the buffer layer 11, the first passivation layer 12, the second passivation layer 15 and the third passivation layer 16 may form an inorganic material layer; and the first conductive layer and the second conductive layer may form a conductive layer. In the pad area 201, the first planarization layer 13 (or the first planarization layer 13 and the third planarization layer 18) in the bonding structure layer may form an organic material layer; the buffer layer 11, the first passivation layer 12, the second passivation layer 15 and the third passivation layer 16 may form an inorganic material layer; and the first conductive layer and the second conductive layer may form a conductive layer. In an exemplary implementation, a thickness of the organic material layer in the bonding structure layer may be smaller than a thickness of the organic material layer in the pixel structure layer, i.e., the organic material layer in the bonding structure layer is not provided with a second planarization layer.

Exemplary description is made below through a preparation process of a display backplane. A "patterning process" mentioned in the present disclosure includes photoresist coating, mask exposure, development, etching, photoresist stripping, and other treatments for a metal material, an inorganic material, or a transparent conductive material, and includes an organic material coating, mask exposure, development, and other treatments for an organic material. Deposition may be any one or more of sputtering, evaporation, and chemical vapor deposition; coating may be any one or more of spray coating, spin coating, and ink-jet printing; and etching may be any one or more of dry etching and wet etching, which is not limited in present disclosure. A "thin film" refers to a layer of thin film made of a material on a substrate through a process such as depositing, coating, or the like. If the "thin film" does not need a patterning process in an entire preparation process, the "thin film" may also be called a "layer". If the "thin film" needs the patterning process in the entire preparation process, it is called a "thin film" before the patterning process, and called a "layer" after the patterning process. The "layer" after the patterning process includes at least one "pattern". "A and B being arranged on a same layer" mentioned in the present disclosure means that A and B are formed simultaneously through a single patterning process, and a "thickness" of a film layer is a dimension of the film layer in a direction perpendicular to the display backplane. In an exemplary implementation of the present disclosure, "an orthographic projection of B is within the range of an orthographic projection of A" or "an orthographic projection of A includes an orthographic projection of B" refers to that a boundary of the orthographic projection of B falls within a boundary range of the orthographic projection of A, or the boundary of the orthographic projection of A overlaps with the boundary of the orthographic projection of B.

In an exemplary implementation, a preparation process of a display backplane according to an exemplary embodiment of the present disclosure may include the following operations.

Figure 4:
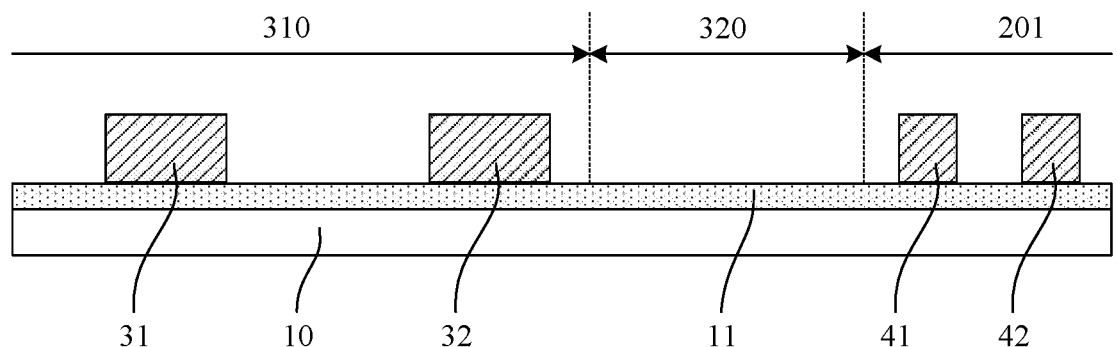
FIG. 4 is a schematic diagram after a pattern of a first conductive layer is formed in a display backplane according to the present disclosure.

(11) A pattern of a first conductive layer is formed. In an exemplary implementation, forming a first conductive layer may include: sequentially forming, on a substrate 10, a buffer layer 11 and a pattern of a first conductive layer arranged on the buffer layer 11. The pattern of the first conductive layer at least includes a first electrode 31, a second electrode 32, a first bonding electrode 41, and a second bonding electrode 42, as shown in FIG. 4.

In an exemplary implementation, the first electrode 31 and the second electrode 32 may be located in a pixel area 310, and the first bonding electrode 41 and the second bonding electrode 42 may be located in a bonding pad area 201.

In an exemplary implementation, the first electrode may be a first drive line, or may be a drive lead connected to the first drive line, or may be a second drive line, or may be a drive lead connected to the second drive line. The second electrode may be a first chip terminal, or may be a second chip terminal, or may be a third chip terminal. The first bonding electrode and the second bonding electrode may be corresponding leads, which will not be limited here in the present disclosure.

In an exemplary implementation, the buffer layer may be made of any one or more of silicon oxide (SiOx), silicon nitride (SiNx), and silicon oxynitride (SiON), and may be a single-layer structure or a multi-layer composite structure. For example, the buffer layer may be made of silicon nitride SiN.

In an exemplary implementation, a thickness of the buffer layer may be about 150 nm to 300 nm. For example, the thickness of the buffer layer may be about 165 nm.

In an exemplary implementation, the first conductive layer may be made of a metal material, e.g., any one or more of copper (Cu), aluminum (Al), titanium (Ti), molybdenum (Mo), chromium (Cr) and tungsten (W), or an alloy material of the above metals, e.g., aluminum neodymium alloy (AlNd) or molybdenum niobium alloy (MoNb), and may be a single-layer structure or a multi-layer composite structure, e.g., MoNb/Cu/MoNb. For example, the first conductive layer may include a first sublayer, a second sublayer and a third sublayer which are stacked, the first sublayer is arranged on a side of the buffer layer 11 away from the substrate, the second sublayer is arranged on a side of the first sublayer away from the substrate, and the third sublayer is arranged on a side of the second sublayer away from the substrate. The first sublayer may be made of molybdenum niobium alloy MoNb, which is used for improving adhesion, the second sublayer may be made of copper (Cu), which is used for reducing resistance, and the third sublayer may be made of MoNb, which is used for preventing oxidation, The first sublayer, the second sublayer and the third sublayer form a MoNb/Cu/MoNb stacked structure.

In an exemplary implementation, an overall thickness of the first conductive layer may be about 1.5 μm to 7 μm. According to the law of resistance, the larger the sectional area of the wiring is, the smaller the resistance is. Thus, a relatively thick first conductive layer may reduce the resistance and improve the electrical performance.

In an exemplary implementation, the thickness of the first sublayer may be about 20 nm to 40 nm, e.g., 30 nm; and the thickness of the third sublayer may be about 10 nm to 30 nm, e.g., 20 nm.

In an exemplary implementation, the following manner may be used for this process. First, a first insulating thin film is deposited on a substrate by chemical vapor deposition (CVD) to form a buffer layer 11 arranged on the substrate 10. Then, a first metal thin film is deposited on the buffer layer 11 by means of magnetron sputtering (Sputter), and the first metal thin film is patterned by a patterning process to form a first sublayer on the buffer layer 11. The first sublayer serves as a seed layer and is configured to increase a grain crystal nucleation density. Then, a second sublayer is electroplated on the first sublayer by an electroplating process. Then, a third sublayer serving as an anti-oxidation layer is prepared on the second sublayer. The first sublayer may be made of MoNiTi, the second sublayer may be made of copper (Cu), and the third sublayer may be made of MoNiTi.

In an exemplary implementation, the substrate may be a rigid substrate or a flexible substrate, the rigid substrate may be glass or the like, and the flexible substrate may be polyimide (PI) or the like.

In an exemplary implementation, before the formation of the first conductive layer, a mark layer may be prepared first by a patterning process, a material of the mark layer may be molybdenum or the like, and then the buffer layer and the first conductive layer are sequentially formed.

Figure 5:
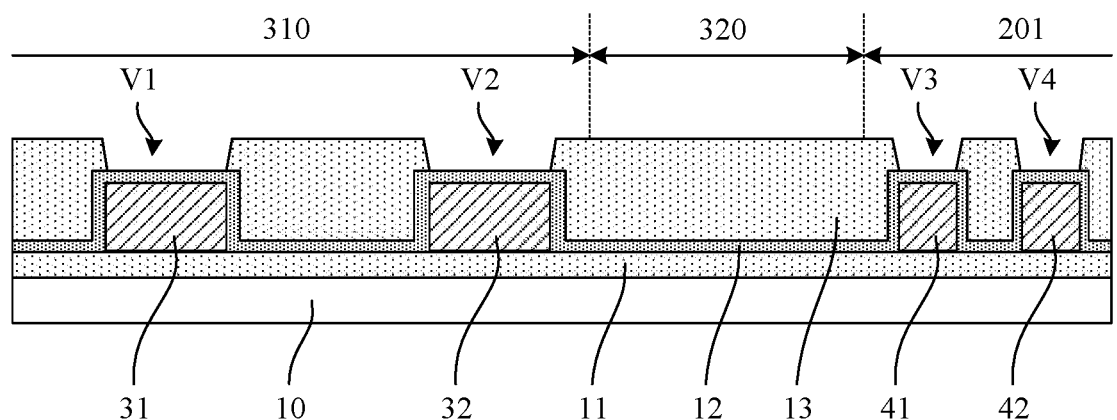
FIG. 5 is a schematic diagram after a pattern of a first planarization layer is formed in a display backplane according to the present disclosure.

(12) A first passivation layer and a pattern of a first planarization layer are formed. In an exemplary implementation, forming a first passivation layer and a pattern of a first planarization layer may include: depositing a first passivation thin film first on the substrate on which the aforementioned pattern is formed, then coating a layer of a first planarization thin film, and patterning the first planarization thin film by a patterning process to form a first passivation layer 12 covering the pattern of the first conductive layer, and a pattern of a first planarization layer 13 arranged on the first passivation layer 12. Patterns of a plurality of via holes are formed on the first planarization layer 13, and the plurality of via holes may at least include: a first via hole V1, a second via hole V2, a third via hole V3, and a fourth via hole V4, as shown in FIG. 5.

In an exemplary implementation, the first passivation layer 12 and the first planarization layer 13 may be located in the pixel area 310, the light transmitting area 320 and the bonding pad area 201. The first passivation layer 12 of the pixel area 310 wraps the first electrode 31 and the second electrode 32, and the first passivation layer 12 of the bonding pad area 201 wraps the first bonding electrode 41 and the second bonding electrode 42.

In an exemplary implementation, the first via hole V1 and the second via hole V2 may be located in the pixel area 310, and the third via hole V3 and the fourth via hole V4 may be located in the bonding pad area 201. A position of the first via hole V1 may correspond to a position of the first electrode 31, an orthographic projection of the first via hole V1 on the substrate may be within a range of an orthographic projection of the first electrode 31 on the substrate, and the first planarization layer 13 in the first via hole V1 is removed to expose the first passivation layer 12 covering the first electrode 31. A position of the second via hole V2 may correspond to a position of the second electrode 32, an orthographic projection of the second via hole V2 on the substrate may be within the range of an orthographic projection of the second electrode 32 on the substrate, and the first planarization layer 13 in the second via hole V2 is removed to expose the first passivation layer 12 covering the second electrode 32. A position of the third via hole V3 may correspond to a position of the first bonding electrode 41, an orthographic projection of the third via hole V3 on the substrate may be within the range of an orthographic projection of the first bonding electrode 41 on the substrate, and the first planarization layer 13 in the third via hole V3 is removed to expose the first passivation layer 12 covering the first bonding electrode 41. A position of the fourth via hole V4 may correspond to a position of the second bonding electrode 42, an orthographic projection of the fourth via hole V4 on the substrate may be within the range of an orthographic projection of the second bonding electrode 42 on the substrate, and the first planarization layer 13 in the fourth via hole V4 is removed to expose the first passivation layer 12 covering the second bonding electrode 42.

In an exemplary implementation, the first passivation layer 12 may be made of any one or more of silicon oxide (SiOx), silicon nitride (SiNx), and silicon oxynitride (SiON), and may be a single-layer structure or a multi-layer composite structure. For example, the first planarization layer 13 may be made of silicon nitride $Si_3N_4$.

In an exemplary implementation, a thickness of the first passivation layer may be about 150 nm to 320 nm. For example, the thickness of the first passivation layer may be about 150 nm.

In an exemplary implementation, the first planarization layer 12 may be made of an organic material, such as resin or the like.

In an exemplary implementation, a thickness of the first planarization layer may be about 4000 nm to 6000 nm. For example, the thickness of the first planarization layer may be about 4500 nm.

Figure 6:
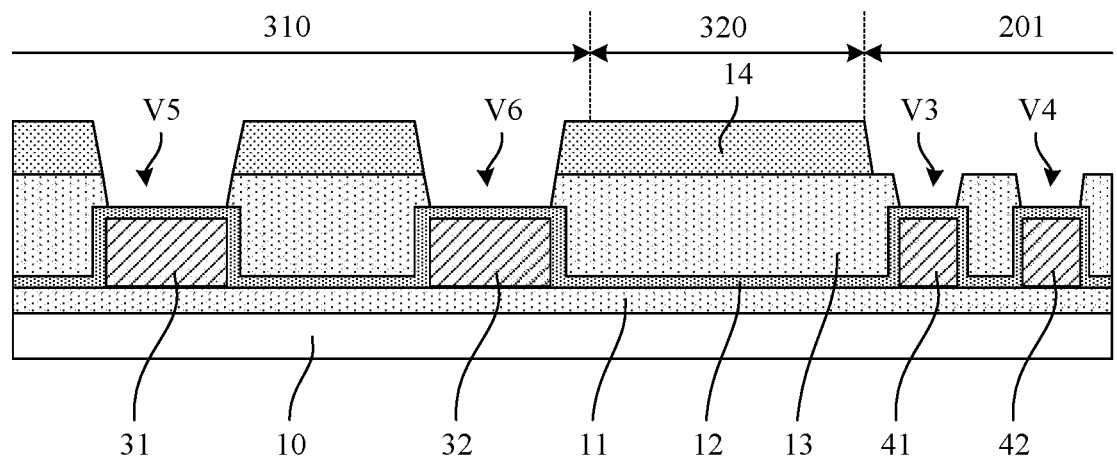
FIG. 6 is a schematic diagram after a pattern of a second planarization layer is formed in a display backplane according to the present disclosure.

(13) A pattern of a second planarization layer is formed. In an exemplary implementation, forming a pattern of a second planarization layer may include: coating a layer of a second planarization thin film on the substrate on which the aforementioned patterns are formed, and patterning the second planarization thin film by a patterning process to form a pattern of a second planarization layer 14 on the first planarization layer 13. Patterns of a plurality of via holes are formed on the second planarization layer 14, and the plurality of via holes may at least include: a fifth via hole V5 and a sixth via hole V6, as shown in FIG. 6.

In an exemplary implementation, the second planarization layer 14 is formed only in the pixel area 310 and the light transmitting area 320, and the second planarization layer 14 of the bonding pad area 201 is removed.

In an exemplary implementation, the fifth via hole V5 and the sixth via hole V6 may be located in the pixel area 310. A position of the fifth via hole V5 may correspond to a position of the first via hole V1 on the first planarization layer 13, and the second planarization layer 14 in the fifth via hole V5 is removed to communicate with the first via hole V1 and expose the first passivation layer 12 covering the first electrode 31. A position of the sixth via hole V6 may correspond to a position of the second via hole V2 on the first planarization layer 13, and the second planarization layer 14 in the sixth via hole V6 is removed to communicate with the second via hole V2 and expose the first passivation layer 12 covering the second electrode 32.

In an exemplary implementation, the pixel area 310 employs two planarization layers, the bonding pad area 201 employs one planarization layer, and the thickness of the organic material layer in the pad area 201 is smaller than the thickness of the organic material layer in the pixel area 310. In the present disclosure, by reducing the thickness of the organic material layer of the pad area 201, a height difference of the pad area 201 may be reduced, avoiding poor bonding caused by a relatively large height difference, and the bonding process quality can be improved, thereby improving the yield of the display backplane.

In an exemplary implementation, the second planarization layer 14 may be made of an organic material, such as resin or the like.

In an exemplary implementation, a thickness of the second planarization layer may be about 4000 nm to 6000 nm. For example, the thickness of the second planarization layer may be about 4500 nm.

Figure 7:
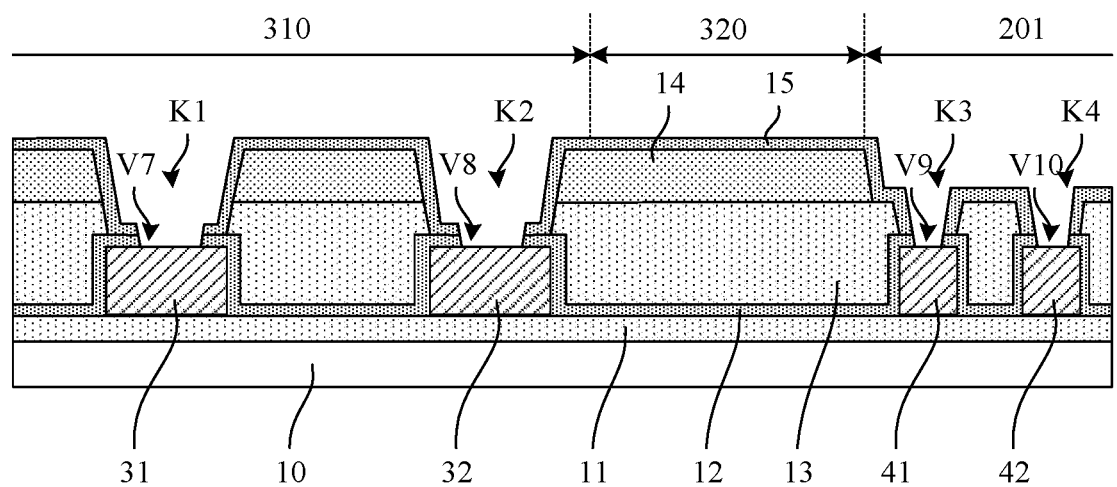
FIG. 7 is a schematic diagram after a pattern of a second passivation layer is formed in a display backplane according to the present disclosure.

(14) A pattern of a second passivation layer is formed. In an exemplary implementation, forming a pattern of a second passivation layer may include: depositing a second passivation thin film on the substrate on which the aforementioned patterns are formed, and patterning the second passivation thin film by a patterning process to form a pattern of a second passivation layer 15. Patterns of a plurality of via holes are formed on the second passivation layer 15, and the plurality of via holes may at least include: a seventh via hole V7, an eighth via hole V8, a ninth via hole V9, and a tenth via hole V10, as shown in FIG. 7.

In an exemplary implementation, the seventh via hole V7 and the eighth via hole V8 may be located in the pixel area 310, and the ninth via hole V9 and the tenth via hole V10 may be located in the pad area 201. The seventh via hole V7 may be located in the first via hole V1, and the second passivation layer 15 and the first passivation layer 12 in the seventh via hole V7 are etched away to expose a surface of the first electrode 31. The eighth via hole V8 may be located in the second via hole V2, and the second passivation layer 15 and the first passivation layer 12 in the eighth via hole V8 are etched away to expose a surface of the second electrode 32. The ninth via hole V9 may be located in the third via hole V3, and the second passivation layer 15 and the first passivation layer 12 in the ninth via hole V9 are etched away to expose a surface of the first bonding electrode 41. The tenth via hole V10 may be located in the fourth via hole V4, and the second passivation layer 15 and the first passivation layer 12 in the tenth via hole V10 are etched away to expose a surface of the second bonding electrode 42.

In an exemplary implementation, the first via hole V1, the fifth via hole V5 and the seventh via hole V7 which are communicated with each other form a first connection via hole K1, and the first connection via hole K1 is configured so that a subsequently formed positive connection terminal is connected to the first electrode 31 through this via hole. The second via hole V2, the sixth via hole V6 and the eighth via hole V8 which are communicated with each other form a second connection via hole K2, and the second connection via hole K2 is configured so that a subsequently formed negative connection terminal is connected to the second electrode 32 through this via hole. The third via hole V3 and the ninth via hole V9 which are communicated with each other form a third connection via hole K3, and the third connection via hole K3 is configured so that a subsequently formed first bonding terminal is connected to the first bonding electrode 41 through this via hole. The fourth via hole V4 and the tenth via hole V10 which are communicated with each other form a fourth connection via hole K4, and the fourth connection via hole K4 is configured so that a subsequently formed second bonding terminal is connected to the second bonding electrode 42 through this via hole.

In an exemplary implementation, the second passivation layer 15 may be made of any one or more of silicon oxide (SiOx), silicon nitride (SiNx), and silicon oxynitride (SiON), and may be a single-layer structure or a multi-layer composite structure.

In an exemplary implementation, the second passivation layer 15 may include a first passivation sublayer and a second passivation sublayer which are stacked, the second passivation sublayer is arranged on a side of the first passivation sublayer away from the substrate, the first passivation sublayer may be made of silicon nitride $Si_3N_4$, and the second passivation sublayer may be made of loose silicon nitride $Si_3N_4$. Different from ordinary silicon nitride, for loose silicon nitride, the etching profile may be adjusted by adjusting the etching rate, but there is little optical difference between ordinary silicon nitride and loose silicon nitride.

In an exemplary implementation, a thickness of the first passivation sublayer may be about 80 nm to 250 nm, and a thickness of the second passivation sublayer may be about 10 nm to 30 nm. For example, the thickness of the first passivation sublayer may be about 80 nm, and the thickness of the second passivation sublayer may be about 20 nm.

In an exemplary implementation, an overall thickness of the second passivation layer (the sum of the thickness of the first passivation sublayer and the thickness of the second passivation sublayer) may be about 100 nm to 270 nm. For example, the overall thickness of the second passivation layer may be about 100 nm.

Figure 8:
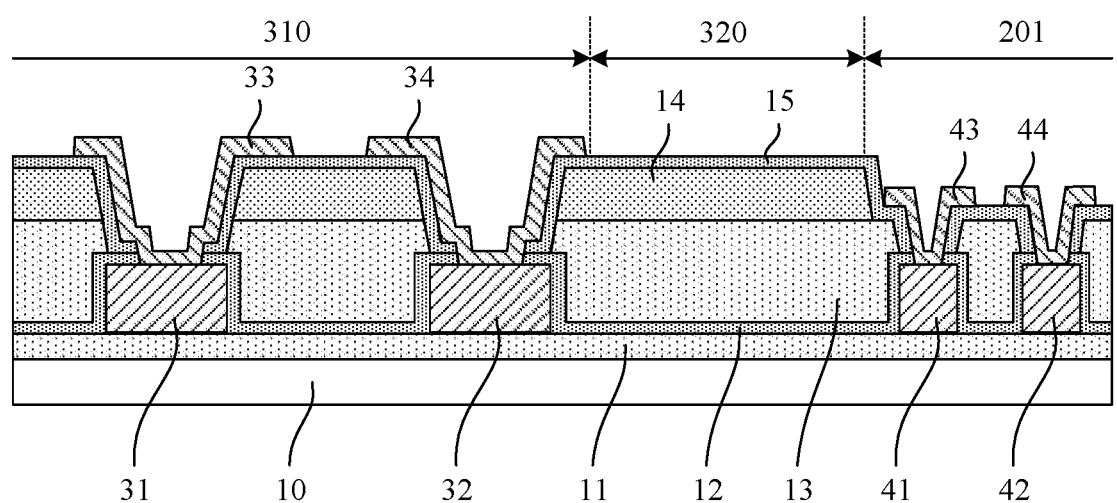
FIG. 8 is a schematic diagram after a pattern of a second conductive layer is formed in a display backplane according to the present disclosure.

(15) A pattern of a second conductive layer is formed. In an exemplary implementation, forming a pattern of a second conductive layer may include: depositing a second metal thin film on the substrate on which the aforementioned patterns are formed, and patterning the second metal thin film by a patterning process to form a pattern of a second conductive layer on the second passivation layer 15. The pattern of the second conductive layer at least includes a positive connection terminal 33, a negative connection terminal 34, a first bonding terminal 43 and a second bonding terminal 44, as shown in FIG. 8.

In an exemplary implementation, the positive connection terminal 33 and the negative connection terminal 34 may be located in the pixel area 310, and the first bonding terminal 43 and the second bonding terminal 44 may be located in the bonding pad area 201.

In an exemplary implementation, the positive connection terminal 33 may be connected to the first electrode 31 through the first connection via hole K1, the negative connection terminal 34 may be connected to the second electrode 32 through the second connection via hole K2, the first bonding terminal 43 may be connected to the first bonding electrode 41 through the third connection via hole K3, and the second bonding terminal 44 may be connected to the second bonding electrode 42 through the fourth connection via hole K4.

In the exemplary implementation, the positive connection terminal 33 is configured to be connected to a positive electrode of a light emitting diode, the negative connection terminal 34 is configured to be connected to a negative electrode of the light emitting diode, and the first bonding terminal 43 and the second bonding terminal 44 are configured to be bonding-connected to a flexible printed circuit.

In an exemplary implementation, the second conductive layer may be a single-layer structure or a multi-layer structure. For example, the single-layer structure may be made of copper, and may have a thickness of about 600 nm. For another example, stacked MoNb/Cu/CuNi may be used for the multi-layer structure. For the stacked structure MoNb/Cu/CuNi, a bottom layer is made of a molybdenum-niobium alloy (MoNb), which may improve adhesion, and a thickness of the molybdenum-niobium alloy (MoNb) may be about 20 nm to 40 nm, e.g., 30 nm. A top layer is made of a copper-nickel alloy (CuNi), which may give consideration to both anti-oxidation and die-bonding firmness, and a thickness of the copper-nickel alloy (CuNi) may be about 50 nm to 100 nm. In an exemplary implementation, the top layer may be made of nickel (Ni) or indium tin oxide (ITO), which is not limited here in the present disclosure.

Figure 9:
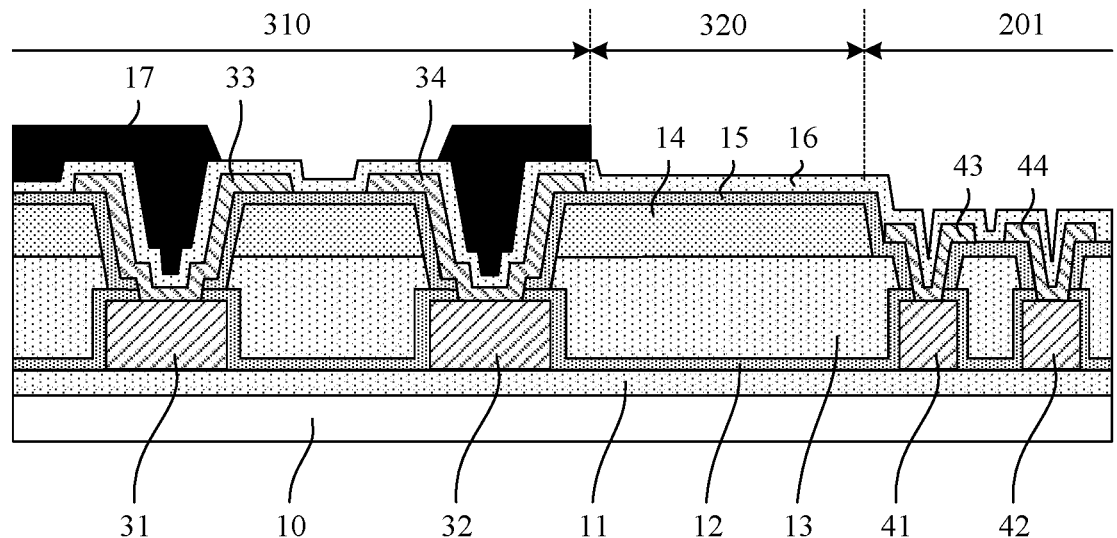
FIG. 9 is a schematic diagram after a pattern of a third passivation layer is formed in a display backplane according to the present disclosure.

(16) A third passivation layer and a pattern of a black matrix are formed. In an exemplary implementation, forming the third passivation layer and the pattern of a black matrix may include: first depositing a third passivation thin film and then coating a layer of a black matrix thin film on the substrate on which the aforementioned patterns are formed, and patterning the black matrix thin film by a patterning process to form a third passivation layer 16 covering the pattern of the second conductive layer and a pattern of a black matrix 17 arranged on the third passivation layer 16, as shown in FIG. 9.

In an exemplary implementation, the third passivation layer 16 may be located in the pixel area 310, the light transmitting area 320, and the bonding pad area 201, the black matrix 17 may be located in the pixel area 310, the black matrix 17 is provided with a black matrix opening, and the black matrix 17 in the black matrix opening is removed to expose the third passivation layer 16.

In an exemplary implementation, an orthographic projection of the black matrix 17 on the substrate overlaps at least partially with orthographic projections of the first electrode 31 and the second electrode 32 on the substrate, the orthographic projection of the black matrix 17 on the substrate overlaps at least partially with orthographic projections of the positive connection terminal 33 and the negative connection terminal 34 on the substrate, and the black matrix 17 is configured to reduce the visibility of the electrodes and the terminals and improve the display quality of the display backplane.

In an exemplary implementation, the black matrix opening may be located between the first electrode 31 and the second electrode 32, and the black matrix opening is configured to receive a first mounting via hole and a second mounting via hole which are formed subsequently.

In an exemplary implementation, the third passivation layer 16 may be made of any one or more of silicon oxide (SiOx), silicon nitride (SiNx), and silicon oxynitride (SiON), and may be a single-layer structure or a multi-layer composite structure. For example, the third passivation layer 16 may be made of silicon nitride $Si_3N_4$.

In an exemplary implementation, a thickness of the third passivation layer may be about 180 nm to 350 nm. For example, the thickness of the third passivation layer may be about 180 nm.

Figure 10:
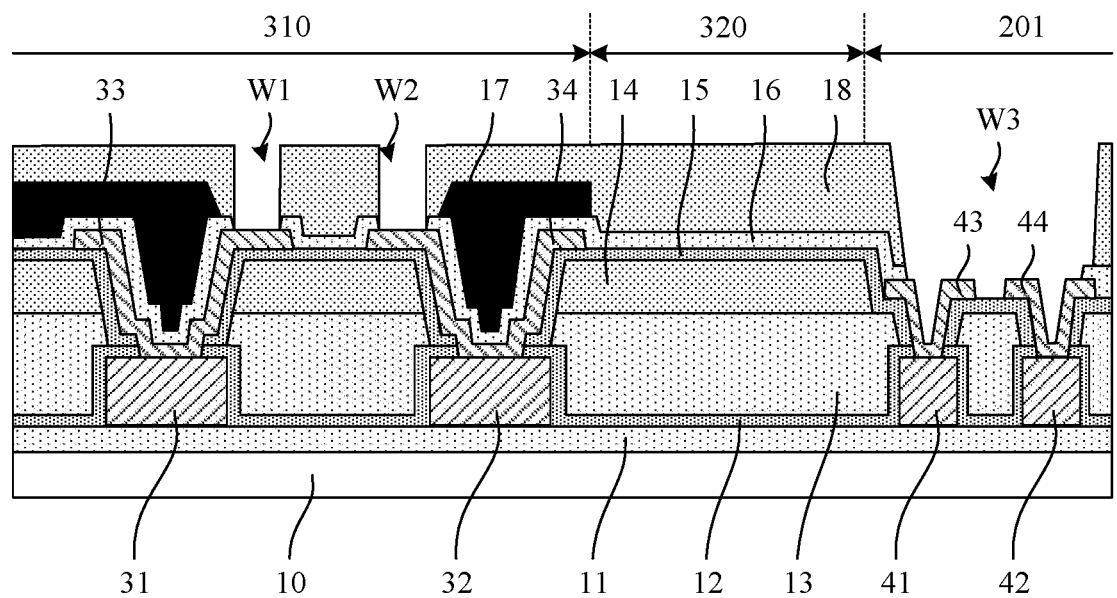
FIG. 10 is a schematic diagram after a pattern of a third planarization layer is formed in a display backplane according to the present disclosure.

(17) A pattern of a third planarization layer is formed. In an exemplary implementation, forming the pattern of the third planarization layer may include: coating a layer of a third planarization thin film on the substrate on which the aforementioned patterns are formed, and patterning the third planarization thin film by a patterning process to form a pattern of a third planarization layer 18. Patterns of a plurality of via holes are formed on the third planarization layer 18, and the plurality of via holes may at least include: a first mounting via hole W1, a second mounting via hole W2 and a bonding via hole W3, as shown in FIG. 10.

In an exemplary implementation, the third planarization layer 18 may be formed in the pixel area 310, the light transmitting area 320 and the bonding pad area 201.

In an exemplary implementation, the first mounting via hole W1 and the second mounting via hole W2 may be located in the pixel area 310. The first mounting via hole W1 may be located in an area where the positive connection terminal 33 is located, the third planarization layer 18 and the third passivation layer 16 in the first mounting via hole W1 are removed to expose a surface of the positive connection terminal 33, and the first mounting via hole W1 is configured so that a positive electrode of a light emitting diode is connected to the positive connection terminal 33 through this via hole. The second mounting via hole W2 may be located in an area where the negative connection terminal 34 is located, the third planarization layer 18 and the third passivation layer 16 in the second mounting via hole W2 are removed to expose a surface of the negative connection terminal 34, and the second mounting via hole W2 is configured so that a negative electrode of a light emitting diode is connected to the negative connection terminal 34 through the via hole.

In an exemplary implementation, the bonding via hole W3 may be located in the bonding pad area 201, and the third planarization layer 18 and the third passivation layer 16 in the bonding via hole W3 are removed to expose surfaces of the first bonding electrode 41 and the second bonding electrode 42, and the bonding via hole W3 is configured so that a flexible printed circuit is respectively connected to the first bonding electrode 41 and the second bonding electrode 42 through this via hole.

In another exemplary implementation, the third planarization layer 18 may be formed in the pixel area 310 and the light transmitting area 320, the third planarization layer 18 of the bonding pad area 201 is removed and the third passivation layer 16 in the bonding via hole W3 is removed to expose surfaces of the first bonding electrode 41 and the second bonding electrode 42.

In an exemplary implementation, the third planarization layer 18 may be made of an organic material, e.g., resin or the like.

In an exemplary implementation, a thickness of the third planarization layer may be about 2000 nm to 3000 nm. For example, the thickness of the third planarization layer may be about 2200 nm.

Figure 11:
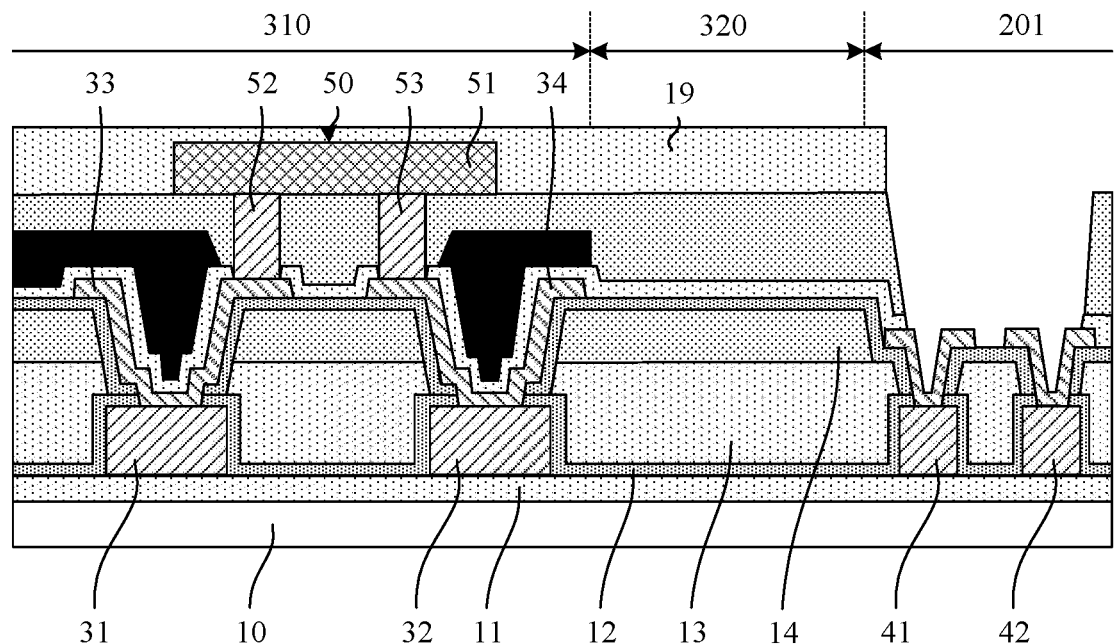
FIG. 11 is a schematic diagram after a pattern of a protective layer is formed in a display backplane according to the present disclosure.

(18) A pattern of a protective layer is formed. In an exemplary implementation, forming the pattern of a protective layer may include: first bonding-connecting a light emitting diode 50 to the positive connection terminal 33 and the negative connection terminal 34 of the pixel area 310, and then coating a layer of a protective thin film to form a pattern of a protective layer 19 covering the light emitting diode 50, as shown in FIG. 11.

In an exemplary implementation, the light emitting diode 50 may at least include a luminous body 51, a positive pin 52 and a negative pin 53, the positive pin 52 and the negative pin 53 being connected to the luminous body 51. The positive pin 52 and the negative pin 53 of the light emitting diode 50 are respectively connected to the positive connection terminal 33 and the negative connection terminal 34 on the display backplane by a weld material, and a weld metal includes a tin metal or a soldering tin silver alloy, which is not limited here in the present disclosure.

In an exemplary implementation, the protective layer 19 may be located in the pixel area 310 and the light transmitting area 320.

In another exemplary implementation, the protective layer 19 may be located in the pixel area 310, the light transmitting area 320 and the bonding pad area 201, and the protective layer 19 of the pad area 201, or the protective layer 19 and the third planarization layer of the pad area 201 are to be removed in a subsequent bonding process.

In an exemplary implementation, the protective layer 19 may be made of a material with a high transmittance, such as polyethylene terephthalate (PET).

Figure 12:
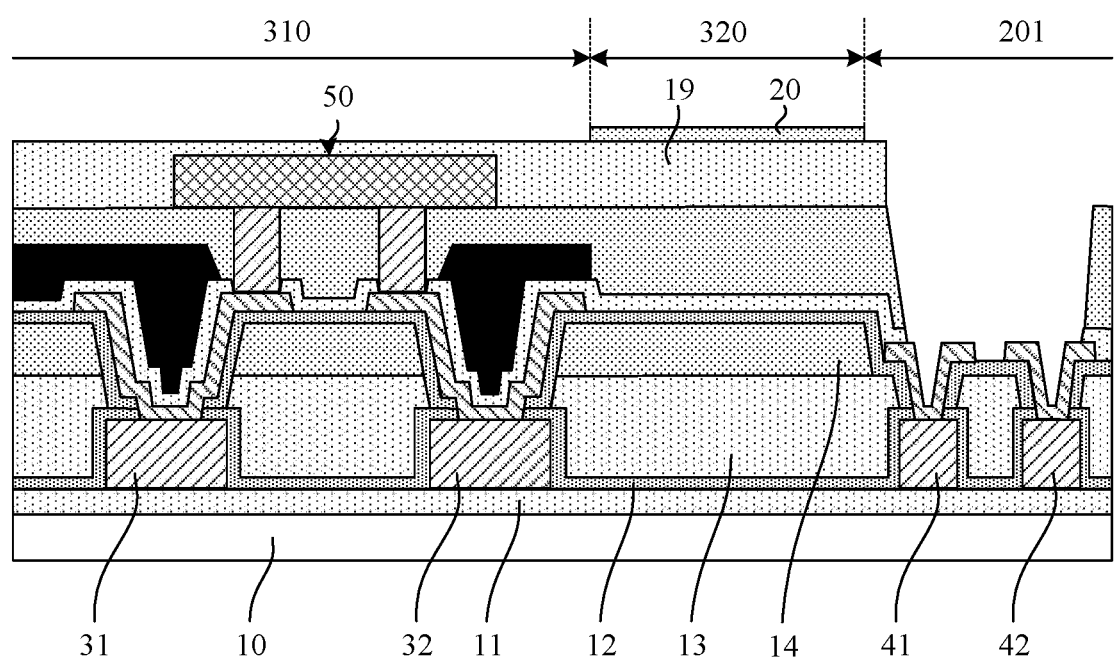
FIG. 12 is a schematic diagram after a pattern of an antireflection layer is formed in a display backplane according to the present disclosure.

(19) A pattern of an antireflection layer is formed. In an exemplary implementation, forming the pattern of the antireflection layer may include: depositing a layer of an antireflection thin film on the substrate on which the aforementioned patterns are formed, and patterning the antireflection thin film by a patterning process to form a pattern of an antireflection layer 20, as shown in FIG. 12.

In an exemplary implementation, the antireflection layer 20 may be formed only in the light transmitting area 320, and the antireflection layer 20 is arranged on the third planarization layer 18 of the light transmitting area 320.

In an exemplary implementation, the plurality of film layers in the light transmitting area will cause light to be reflected at interfaces of the plurality of film layers, resulting in a phase difference in emitted light, leading to a reduction in light transmittance at certain wavelengths. In the present disclosure, by arranging an antireflection layer configured so that light that would otherwise be reflected passes through an antireflection film and then becomes coherent to cancel out, all light in the corresponding wavelengths passes through the display backplane, thereby achieving the effect of increasing the transmittance.

In an exemplary implementation, a material of the antireflection layer 20 may be an inorganic material, e.g., magnesium fluoride $MgF_2$ or the like.

In an exemplary implementation, a thickness of the antireflection layer may be about 50 nm to 500 nm. For example, the thickness of the antireflection layer may be about 100 nm.

So far, the preparation of the display backplane according to an exemplary embodiment of the present disclosure is completed. The pixel area 310 of the display backplane may include a buffer layer 11, a first conductive layer, a first passivation layer 12, a first planarization layer 13, a second planarization layer 14, a second passivation layer 15, a second conductive layer, a third passivation layer 16, a black matrix 17, a third planarization layer 18, and a protective layer 19 which are stacked on a substrate 10. The first conductive layer may include a first electrode 31 and a second electrode 32, and the second conductive layer may include a positive connection terminal 33 and a negative connection terminal 34, the positive connection terminal 33 is connected to the first electrode 31 through a via hole and the negative connection terminal 34 is connected to the second electrode 32 through a via hole. The light transmitting area 320 of the display backplane may include a buffer layer 11, a first passivation layer 12, a first planarization layer 13, a second planarization layer 14, a second passivation layer 15, a third passivation layer 16, a third planarization layer 18, a protective layer 19, and an antireflection layer 20 which are stacked on a substrate 10. The bonding pad area 201 of the display backplane may include a buffer layer 11, a first conductive layer, a first passivation layer 12, a first planarization layer 13, a second passivation layer 15, a second conductive layer, a third passivation layer 16, and a third planarization layer 18 which are stacked on a substrate 10. The first conductive layer may include a first bonding electrode 41 and a second bonding electrode 42, the second conductive layer may include a first bonding terminal 43 and a second bonding terminal 44, the first bonding terminal 43 is connected to the first bonding electrode 41 through a via hole, and the second bonding terminal 44 is connected to the second bonding electrode 42 through a via hole.

In an exemplary implementation, optical simulations are performed for display backplanes without and with an antireflection layer. The results of the optical simulations show that when the light transmitting area 320 is not provided with an antireflection layer 20, the transmittance of the light transmitting area 320 is about 84.15%; and when the light transmitting area 320 is provided with the antireflection layer, the transmittance of the light transmitting area 320 is about 87.49%, with an increase of 3.34% and an improvement proportion of 3.97%. In the optical simulations, the thickness parameters of the various film layers in the light transmitting area 320 are as follows. The thickness of the buffer layer is about 300 nm, the thickness of the first passivation layer is about 150 nm, the sum of the thicknesses of the first planarization layer and the second planarization layer is about 9000 nm, the thickness of the second passivation layer (the thickness of the first passivation sublayer is about 80 nm and the thickness of the second passivation sublayer is about 20 nm) is about 100 nm, the thickness of the third passivation layer is about 180 nm, the thickness of the third planarization layer is about 2200 nm, and the thickness of the antireflection layer is about 100 nm.

As can be seen from the structure and the preparation flow of the display backplane described in the exemplary embodiments of the present disclosure, in a display backplane according to an exemplary embodiment of the present disclosure, by arranging an antireflection layer in the light transmitting area, the transmittance of the light transmitting area is effectively increased and the transmittance of the light transmitting area can reach 87.49%, thereby improving the overall transmittance of the display backplane, which can meet the requirement of transmittance in the application to common indoor scenes. In an exemplary embodiment of the present disclosure, by the design of the thickness of the organic material layer to use a three-layer planarization layer structure in the pixel area and a one-layer or two-layer planarization layer structure in the bonding area, the height difference of the bonding area is effectively reduced, which avoids poor bonding caused by a relatively large height difference, and can improve the quality of the bonding process and improve the yield of the display backplane. The preparation process of the display backplane according to an exemplary embodiment of the present disclosure may be compatible well with an existing preparation process, and the process is simple to implement and is easy to carry out, and has a high production efficiency, a low production cost and a high yield.

Figure 13:
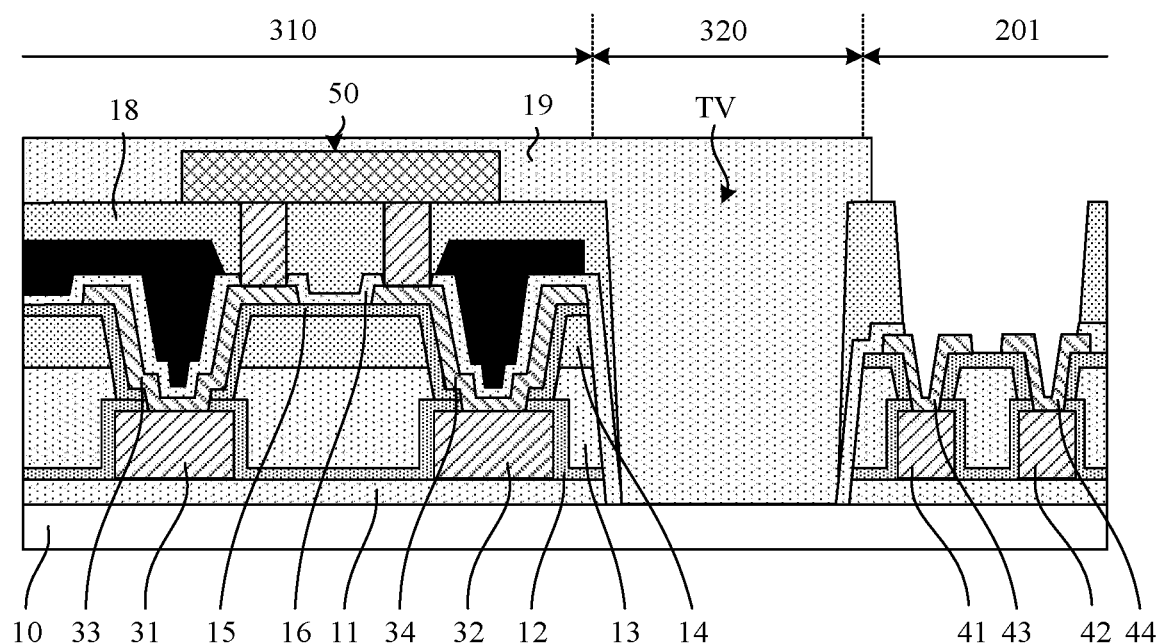
FIG. 13 is a schematic diagram of a sectional structure of another display backplane according to an exemplary embodiment of the present disclosure.

FIG. 13 is a schematic diagram of a sectional structure of another display backplane according to an exemplary embodiment of the present disclosure, illustrating sectional structures of a pixel area 310 and a light transmitting area 320 in a display area and a bonding pad area 201 in a bonding area 200. As shown in FIG. 13, in an exemplary implementation, the pixel area 310 of the display backplane may include a substrate 10, a pixel structure layer arranged on the substrate 10, and a protective layer 19 arranged on a side of the pixel structure layer away from the substrate; the light transmitting area 320 of the display backplane may include a substrate 10, a light transmitting structure layer arranged on the substrate 10, and a protective layer 19 arranged on a side of the light transmitting structure layer away from the substrate; and the bonding pad area 201 of the display backplane may include a substrate 10 and a bonding structure layer arranged on the substrate 10. In an exemplary implementation, the structures of the pixel structure layer of the pixel area 310 and the bonding structure layer of the light transmitting area 320 may be similar to the structures in the embodiment shown in FIG. 3, which will not be repeated here.

In an exemplary implementation, light transmitting holes TV may be provided on the light transmitting structure layer of the light transmitting area 320, and the protective layer 19 fills the light transmitting holes TV.

In an exemplary implementation, the light transmitting holes TV may include a through hole penetrating a buffer layer 11, a through hole penetrating a first passivation layer 12, a through hole penetrating a first planarization layer 13, a through hole penetrating a second planarization layer 14, a through hole penetrating a second passivation layer 15, a through hole penetrating a third passivation layer 16 and a through hole penetrating a third planarization layer 18. The through holes above are communicated with each other. That is, the buffer layer 11, the first passivation layer 12, the first planarization layer 13, the second planarization layer 14, the second passivation layer 15, the third passivation layer 16 and the third planarization layer 18 in the light transmitting holes TV may be removed, and the light transmitting holes TV may expose a surface of the substrate.

In an exemplary implementation, a preparation process of a display backplane according to an exemplary embodiment of the present disclosure may include the following operations.

(21) A pattern of a first conductive layer is formed. In the exemplary implementation, the structures and processes of a buffer layer and a first conductive layer formed may be the same as those in the foregoing exemplary embodiments, which will not be described further here.

Figure 14:
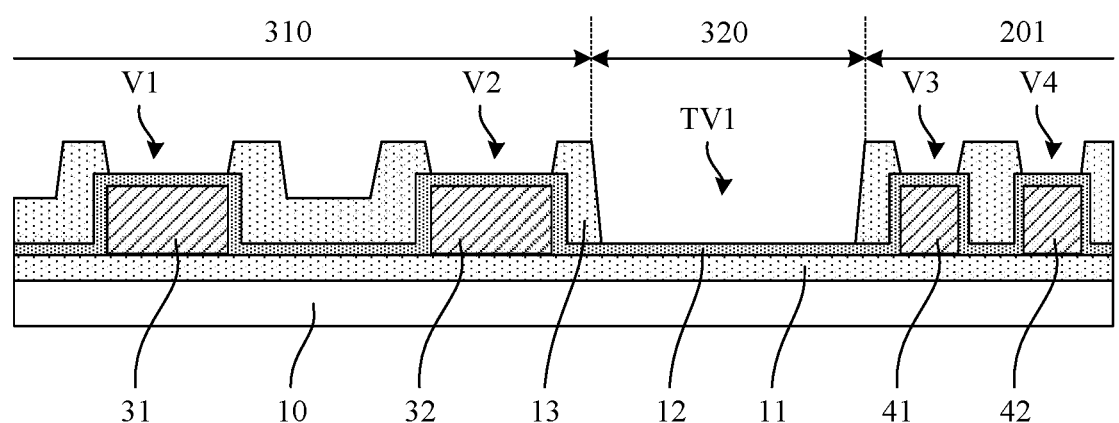
FIG. 14 is a schematic diagram after a pattern of a first planarization layer is formed in another display backplane according to the present disclosure.

(22) A first passivation layer and a pattern of a first planarization layer are formed. In an exemplary implementation, forming the first passivation layer and the pattern of the first planarization layer may include: depositing a first passivation thin film first on a substrate on which the aforementioned pattern is formed, then coating a layer of a first planarization thin film, and patterning the first planarization thin film by a patterning process to form a first passivation layer 12 covering the pattern of the first conductive layer, and a pattern of a first planarization layer 13 arranged on the first passivation layer 12. Patterns of a plurality of via holes are formed on the first planarization layer 13, and the plurality of via holes may at least include:

a first via hole V1, a second via hole V2, a third via hole V3, a fourth via hole V4 and a first light transmitting hole TV1, as shown in FIG. 14.

In an exemplary implementation, the structures of the first passivation layer 12, the first via hole V1, the second via hole V2, the third via hole V3 and the fourth via hole V4 may be the same as those in the foregoing exemplary embodiments, which will not be described further here.

In an exemplary implementation, the first light transmitting hole TV1 may be located in the light transmitting area 320, and the first light transmitting hole TV1 may include a through hole penetrating the first planarization layer 13. That is, the first planarization layer 13 in the first light transmitting hole TV1 is removed to expose the first passivation layer 12 of the light transmitting area 320.

Figure 15:
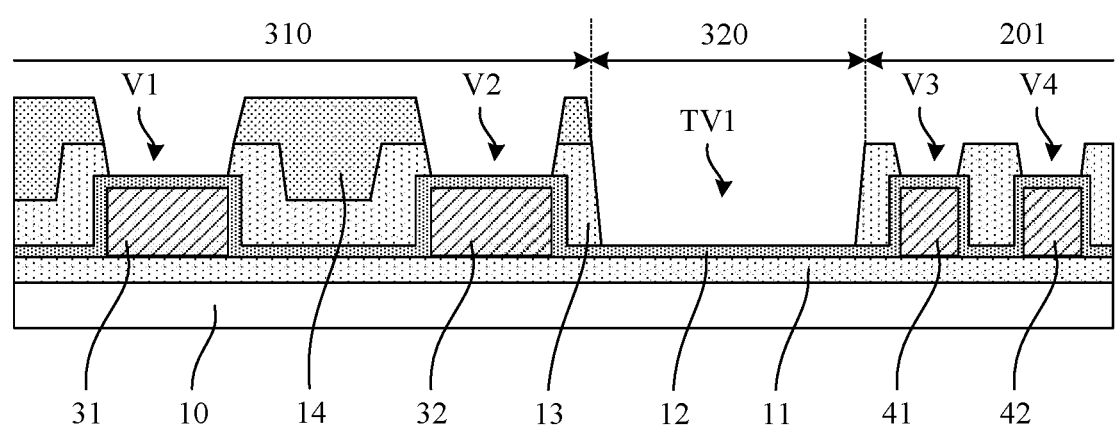
FIG. 15 is a schematic diagram after a pattern of a second planarization layer is formed in another display backplane according to the present disclosure.

(23) A pattern of a second planarization layer is formed. In an exemplary implementation, forming the pattern of the second planarization layer may include: coating a layer of a second planarization thin film on the substrate on which the aforementioned patterns are formed, and patterning the second planarization thin film by a patterning process to form a pattern of a second planarization layer 14 on the first planarization layer 13. Patterns of a plurality of via holes are formed on the second planarization layer 14, and the plurality of via holes may at least include: a fifth via hole V5 and a sixth via hole V6, as shown in FIG. 15.

In an exemplary implementation, the second planarization layer 14 is formed only in the pixel area 310, and the second planarization layer 14 in the light transmitting area 320 and the bonding pad area 201 is removed.

In an exemplary implementation, the structures of the fifth via hole V5 and the sixth via hole V6 may be the same as those in the foregoing exemplary embodiments, which will not be repeated here.

Figure 16:
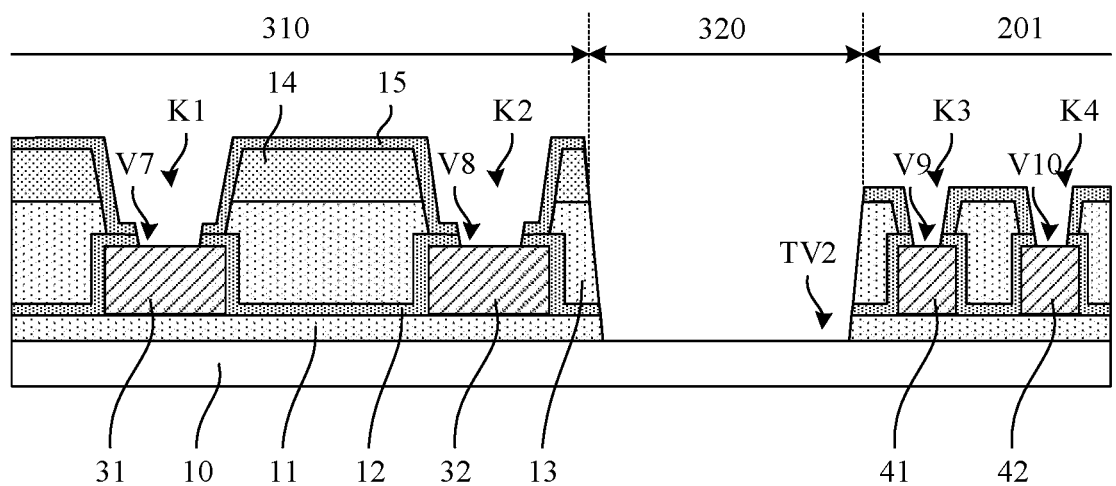
FIG. 16 is a schematic diagram after a pattern of a second passivation layer is formed in another display backplane according to the present disclosure.

(24) A pattern of a second passivation layer is formed. In an exemplary implementation, forming the pattern of the second passivation layer may include: depositing a second passivation thin film on the substrate on which the aforementioned patterns are formed, and patterning the second passivation thin film by a patterning process to form a pattern of a second passivation layer 15. Patterns of a plurality of via holes are formed on the second passivation layer 15, and the plurality of via holes may at least include: a seventh via hole V7, an eighth via hole V8, a ninth via hole V9, a tenth via hole V10 and a second light transmitting hole TV2, as shown in FIG. 16.

In an exemplary implementation, the structures of the seventh via hole V7, the eighth via hole V8, the ninth via hole V9 and the tenth via hole V10 may be the same as those in the foregoing exemplary embodiments, which will not be repeated here.

In an exemplary implementation, the second light transmitting hole TV2 may be located in the first light transmitting hole TV1 of the light transmitting area 320, and the second light transmitting hole TV2 is communicated with the first light transmitting hole TV1. The second light transmitting hole TV2 may include a through hole penetrating the second passivation layer 15, a through hole penetrating the first passivation layer 12 and a through hole penetrating the buffer layer 11, and the through holes above are communicated with each other. That is, the second passivation layer 15, the first passivation layer 12 and the buffer layer 11 in the second light transmitting hole TV2 are etched away to expose the substrate 10 of the light transmitting area 320.

Figure 17:
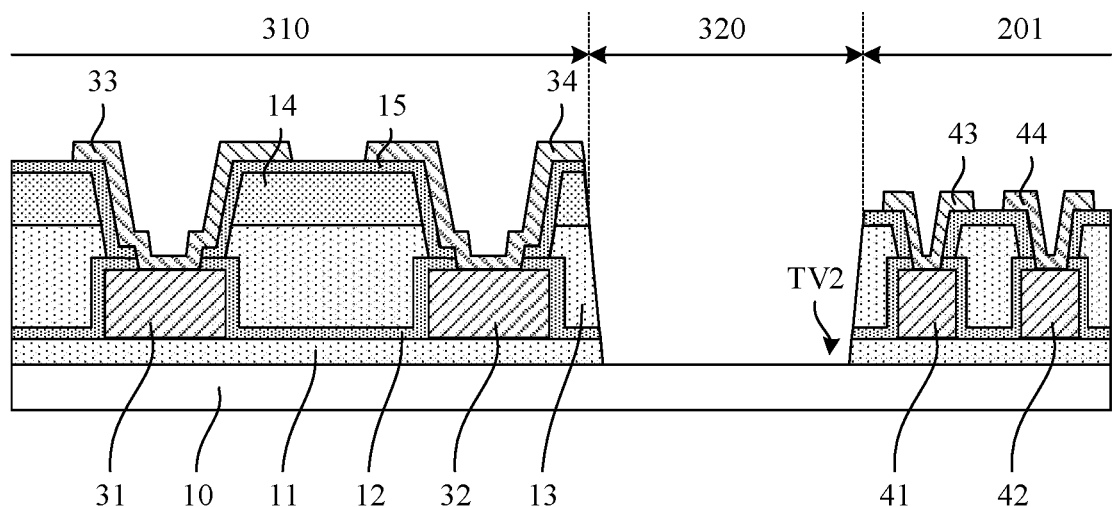
FIG. 17 is a schematic diagram after a pattern of a second conductive layer is formed in another display backplane according to the present disclosure.

(25) A pattern of a second conductive layer is formed. In an exemplary implementation, the structure and process of the formed second conductive layer may be the same as those in the foregoing exemplary embodiments, as shown in FIG. 17, which will not be described further here.

Figure 18:
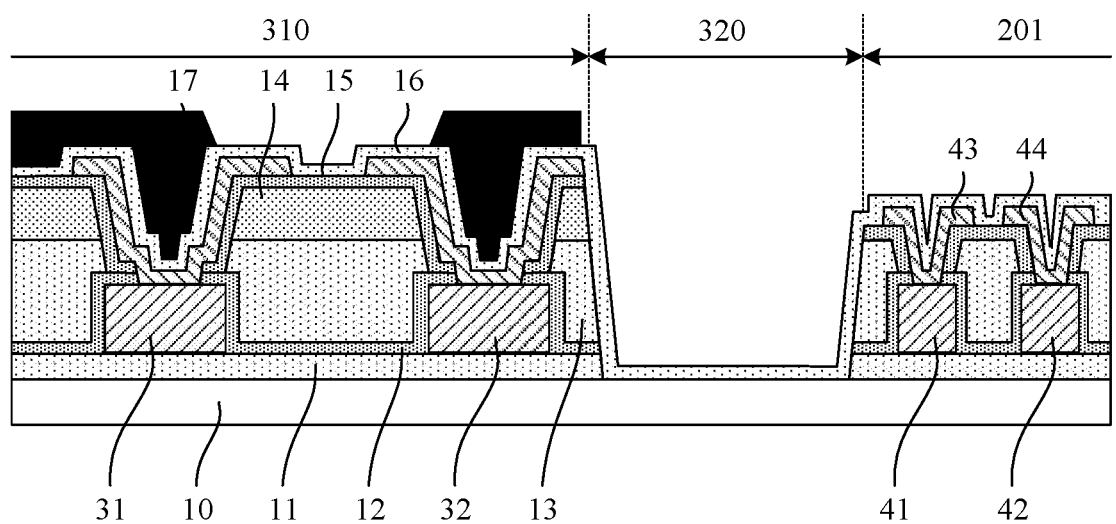
FIG. 18 is a schematic diagram after a pattern of a third passivation layer is formed in another display backplane according to the present disclosure.

(26) A third passivation layer and a pattern of a black matrix are formed. In an exemplary implementation, forming the third passivation layer and the pattern of the black matrix may include: first depositing a third passivation thin film on the substrate on which the aforementioned patterns are formed, then coating a layer of a black matrix thin film, and patterning the black matrix thin film by a patterning process to form a third passivation layer 16 covering the pattern of the second conductive layer and a pattern of a black matrix 17 arranged on the third passivation layer 16, as shown in FIG. 18.

In an exemplary implementation, the third passivation layer 16 may be located in the pixel area 310, the light transmitting area 320 and the bonding pad area 201, and the third passivation layer 16 of the light transmitting area 320 is arranged on a side wall and a bottom surface of the second light transmitting hole TV2.

In an exemplary implementation, the structure of the black matrix 17 may be the same as that in the foregoing exemplary embodiments, which will not be repeated here.

Figure 19:
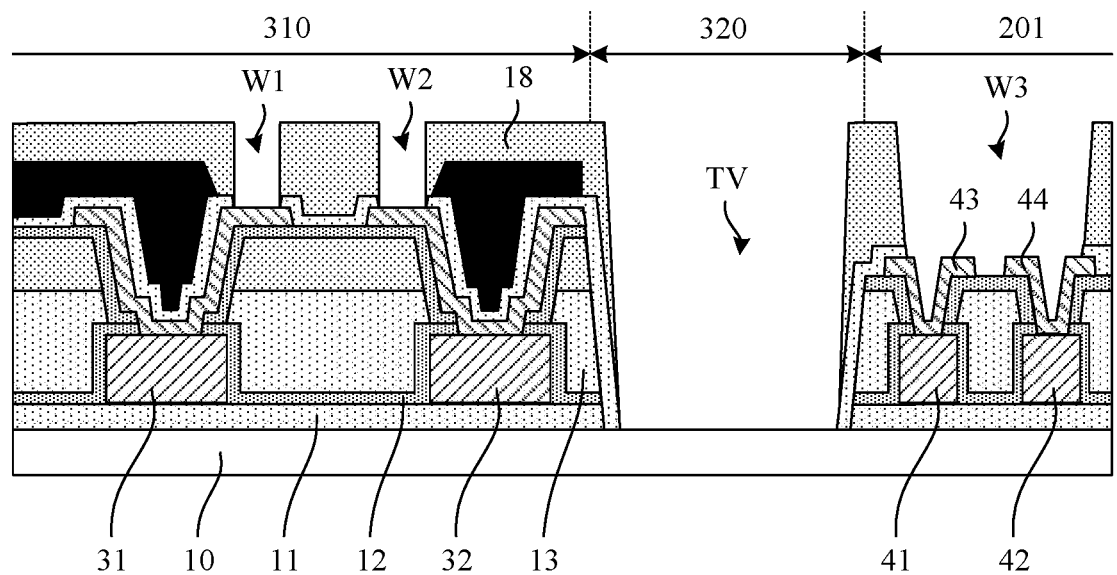
FIG. 19 is a schematic diagram after a pattern of a third planarization layer is formed in another display backplane according to the present disclosure.

(27) A pattern of a third planarization layer is formed. In an exemplary implementation, forming the pattern of the third planarization layer may include: coating a layer of a third planarization thin film on the substrate on which the aforementioned patterns are formed, and patterning the third planarization thin film by a patterning process to form a pattern of a third planarization layer 18. Patterns of a plurality of via holes are formed on the third planarization layer 18, and the plurality of via holes may at least include: a first mounting via hole W1, a second mounting via hole W2, a bonding via hole W3, and a light transmitting hole TV, as shown in FIG. 19.

In an exemplary implementation, the third planarization layer 18 is formed in the pixel area 310, the light transmitting area 320 and the pad area 201.

In an exemplary implementation, the structures of the first mounting via hole W1, the second mounting via hole W2 and the bonding via hole W3 may be the same as those in the foregoing exemplary embodiments, which will not be repeated here.

In an exemplary implementation, the light transmitting hole TV may be located in the light transmitting area 320, and the light transmitting hole TV may include a through hole penetrating the third planarization layer 18 and a through hole penetrating the third passivation layer 16. The through holes above are communicated with each other. That is, the third planarization layer 18 and the third passivation layer 16 in the light transmitting hole TV are removed to expose the substrate 10 of the light transmitting area 320.

Figure 20:
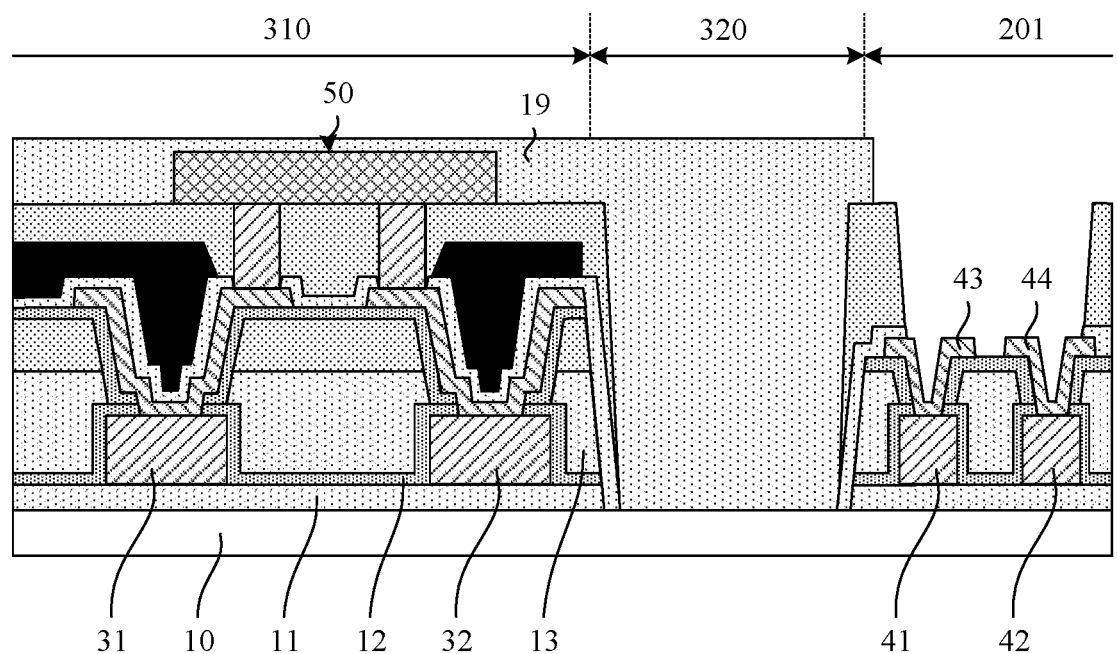
FIG. 20 is a schematic diagram after a pattern of a protective layer is formed in another display backplane according to the present disclosure.

(28) A pattern of a protective layer is formed. In an exemplary implementation, forming the pattern of the protective layer may include: first bonding-connecting a light emitting diode 50 to the positive connection terminal 33 and the negative connection terminal 34 of the pixel area 310, and then coating a layer of a protective thin film to form a pattern of a protective layer 19 covering the light emitting diode and the light transmitting hole TV, as shown in FIG. 20.

In an exemplary implementation, the protective layer 19 may be located in the pixel area 310 and the light transmitting area 320, and the protective layer 19 in the light transmitting area 320 fills the light transmitting hole TV.

So far, the preparation of the display backplane according to an exemplary embodiment of the present disclosure is completed. The film layer structures of the pixel area 310 and the bonding pad area 201 of the display backplane are the same as those in the foregoing exemplary embodiments. The light transmitting area 320 of the display backplane may include a light transmitting structure layer arranged on the substrate 10, the light transmitting structure layer is provided with light transmitting holes, and the film layers in the light transmitting holes are removed, and the protective layer 19 fills the light transmitting holes. The light transmitting structure layer may include a buffer layer 11, a first passivation layer 12, a first planarization layer 13, a second planarization layer 14, a second passivation layer 15, a third passivation layer 16 and a third planarization layer 18 which are stacked.

In an exemplary implementation, optical simulations are performed for display backplanes without and with light transmitting holes. The results of the optical simulations show that when the light transmitting area 320 is not provided with light transmitting holes, the transmittance of the light transmitting area 320 is about 84.15%; and when the light transmitting area 320 is provided with light transmitting holes, the transmittance of the light transmitting area 320 is about 91%, with an increase of 6.85% and an improvement proportion of 8.14%. The thickness parameters of the various film layers are the same as those in the foregoing exemplary embodiments.

As can be seen from the structure and preparation flow of the display backplane described in the present exemplary embodiment, in the display backplane according to an exemplary embodiment of the present disclosure, by providing light transmitting holes in the light transmitting area, the absorption of light by corresponding film layers may be reduced, and a decrease in transmittance caused by reflection of light at the interfaces of multiple film layers can be avoided, which effectively increases the transmittance of the light transmitting area, and the transmittance of the light transmitting area can reach 91%, thereby improving the overall transmittance of the display backplane, which can meet the requirement of transmittance in the application to ordinary indoor scenes.

Figure 21:
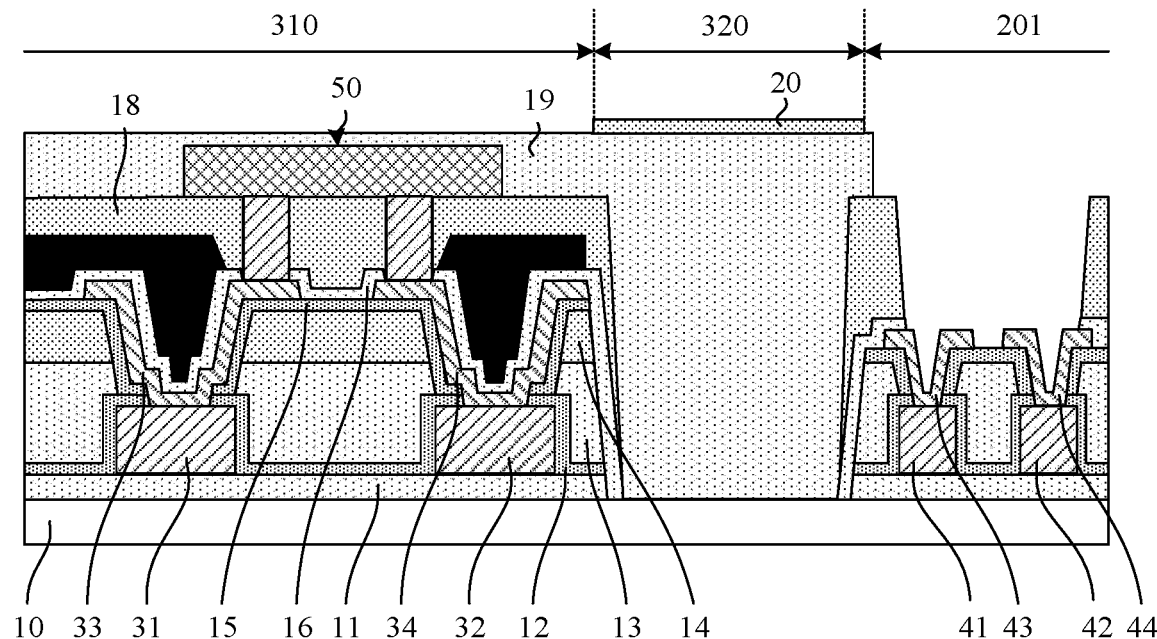
FIG. 21 is a schematic diagram of a sectional structure of still another display backplane according to an exemplary embodiment of the present disclosure.

FIG. 21 is a schematic diagram of a sectional structure of still another display backplane according to an exemplary embodiment of the present disclosure, illustrating sectional structures of a pixel area 310 and a light transmitting area 320 in a display area and a bonding pad area 201 in a bonding area 200. As shown in FIG. 21, in an exemplary implementation, the structures of the pixel structure layer, the light transmitting structure layer and the bonding structure layer of the display backplane may be substantially similar to those in the embodiment shown in FIG. 13, except for the provision of an antireflection layer 20 in the light transmitting area 320.

In an exemplary implementation, the antireflection layer 20 may be formed only in the light transmitting area 320, and the antireflection layer 20 is arranged on the protective layer 19 of the light transmitting area 320. The antireflection layer 20 is configured so that light that would otherwise be reflected passes through an antireflection film and then becomes coherent to cancel out, thereby allowing all light in the corresponding wavelengths to pass through the display backplane, achieving the effect of increasing the transmittance.

In an exemplary implementation, a material of the antireflection layer 20 may be magnesium fluoride $MgF_2$ or the like, and a thickness of the antireflection layer may be about 50 nm to 500 nm. For example, the thickness of the antireflection layer may be about 100 nm.

In an exemplary implementation, the preparation process of the display backplane according to an exemplary embodiment of the present disclosure may be substantially similar to the preparation process in the embodiment shown in FIG. 13, except that after the formation of the protective layer 19, an antireflection thin film is deposited, and the antireflection thin film is patterned by a patterning process to form a pattern of an antireflection layer 20.

In an exemplary implementation, optical simulations are performed for display backplanes without and with light transmitting holes and an antireflection layer. The results of the optical simulations show that when the light transmitting area 320 is not provided with the light transmitting holes and the antireflection layer, the transmittance of the light transmitting area 320 is about 84.15%; and when the light transmitting area 320 is provided with the light transmitting holes and the antireflection layer, the transmittance of the light transmitting area 320 is about 95.05%, with an increase of 10.9% and an improvement proportion of 12.95%. The thickness parameters of the various film layers are the same as those in the foregoing exemplary embodiments.

As can be seen from the structure and the preparation flow of the display backplane described in the present exemplary embodiment, in the display backplane according to an exemplary embodiment of the present disclosure, by arranging light transmitting holes and an antireflection layer in the light transmitting area, the transmittance of the light transmitting area is increased to the largest extent, and the transmittance of the light transmitting area can reach 95.05%, thereby greatly improving the overall transmittance of the display backplane, which can meet the requirement of transmittance in the application to common indoor scenes.

Figure 22:
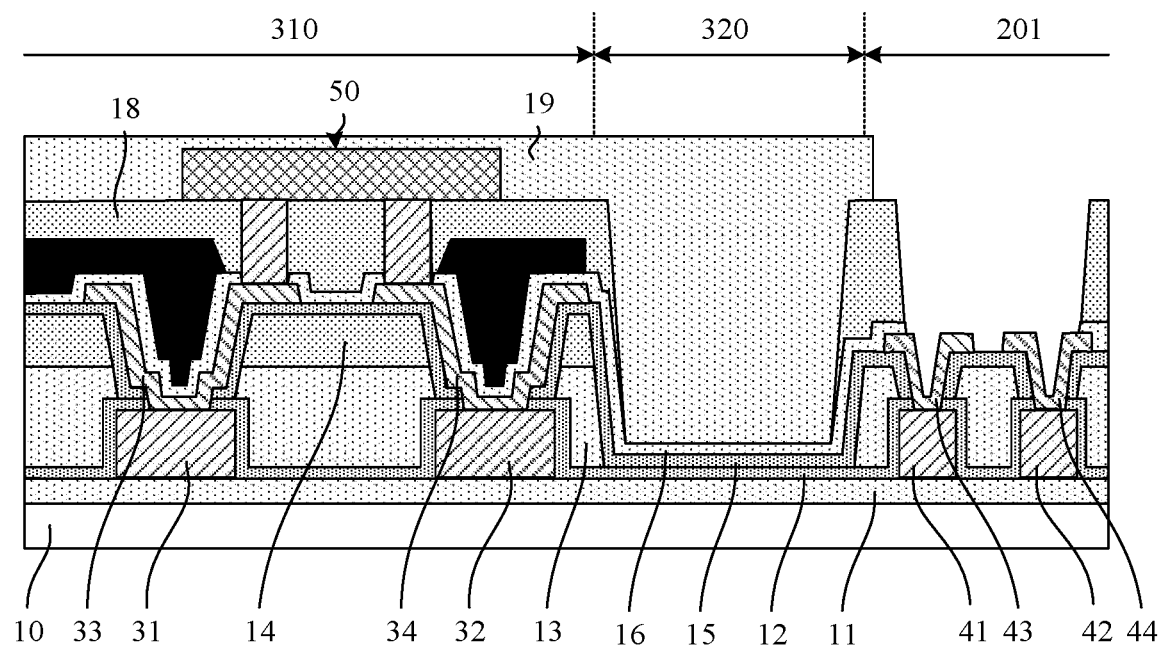
FIG. 22 is a schematic diagram of a sectional structure of still another display backplane according to an exemplary embodiment of the present disclosure.

FIG. 22 is a schematic diagram of a sectional structure of still another display backplane according to an exemplary embodiment of the present disclosure, illustrating sectional structures of a pixel area 310 and a light transmitting area 320 in a display area and a bonding pad area 201 in a bonding area 200. As shown in FIG. 22, in an exemplary implementation, the structures of the pixel structure layer and the bonding structure layer of the display backplane may be substantially similar to those in the embodiment shown in FIG. 13, and a light transmitting hole is provided on the light transmitting structure layer of the display backplane. The difference is that the light transmitting hole is a through hole penetrating an organic material layer, i.e., the organic material layer in the light transmitting hole is removed, and the light transmitting hole may expose a surface of an inorganic material layer.

In an exemplary implementation, in the light transmitting structure layer of the light transmitting area 320, the first planarization layer 13, the second planarization layer 14 and the third planarization layer 18 may form an organic material layer, and the buffer layer 11, the first passivation layer 12, the second passivation layer 15 and the third passivation layer 16 may form an inorganic material layer.

In an exemplary implementation, the buffer layer 11 of the light transmitting area 320 is arranged on the substrate 10, the first passivation layer 12 is arranged on a side of the buffer layer 11 away from the substrate, the second passivation layer 15 is arranged on a side of the first passivation layer 12 away from the substrate, the third passivation layer 16 is arranged on a side of the second passivation layer 15 away from the substrate, and the light transmitting hole TV is arranged on a side of the third passivation layer 16 away from the substrate.

In an exemplary implementation, the light transmitting holes are respectively provided in the first planarization layer 13, the second planarization layer 14 and the third planarization layer 18 of the organic material layer, and include through holes penetrating the first planarization layer 13, the second planarization layer 14 and the third planarization layer 18 respectively, the through holes above are communicated with each other, and the first planarization layer 13, the second planarization layer 14 and the third planarization layer 18 in the light transmitting holes are removed, and the light transmitting holes expose a surface of the third passivation layer 16.

In an exemplary implementation, the preparation process of the display backplane according to an exemplary embodiment of the present disclosure may be substantially similar to the preparation process in the embodiment shown in FIG. 13, except that in forming the pattern of the second passivation layer in step (24), no second light transmitting hole is formed, i.e., the buffer layer 11, the first passivation layer 12 and the second passivation layer 15 in the light transmitting area 320 are retained; and in forming the pattern of the third planarization layer in step (27), only the third planarization layer 18 is removed from the formed light transmitting hole TV, and the third passivation layer 16 of the light transmitting area 320 is retained.

In some possible exemplary implementations, the structure of the light transmitting hole of the light transmitting structure layer in the present exemplary embodiment may be a through hole penetrating the inorganic material layer, the inorganic material layer in the light transmitting hole is removed, and the light transmitting hole may expose a surface of the organic material layer. In some other possible exemplary implementations, the light transmitting hole may be provided on a portion of the organic material layer and a portion of the inorganic material layer. In some further possible exemplary implementations, the light transmitting hole may be provided on any combination of film layers of the light transmitting structure layer, i.e., the light transmitting hole provided on the light transmitting structure layer may include any one or more of: a through hole penetrating the buffer layer 11, a through hole penetrating the first passivation layer 12, a through hole penetrating the first planarization layer 13, a through hole penetrating the second planarization layer 14, a through hole penetrating the second passivation layer 15, a through hole penetrating the third passivation layer 16, and a through hole penetrating the third planarization layer 18, which is not limited here in the present disclosure.

In an exemplary implementation, optical simulations are performed for display backplanes without light transmitting holes and with light transmitting holes on the organic material layer. The results of the optical simulations show that when the light transmitting area 320 is not provided with the light transmitting holes, the transmittance of the light transmitting area 320 is about 84.15%; and when the organic material layer of the light transmitting area 320 is provided with the light transmitting holes, the transmittance of the light transmitting area 320 is about 84.48%, with an increase of 0.33% and an improvement proportion of 3.92%. The thickness parameters of the various film layers are the same as those in the foregoing exemplary embodiments.

As can be seen from the structure and preparation flow of the display backplane described in the present exemplary embodiment, in the display backplane according to an exemplary embodiment of the present disclosure, by providing light transmitting holes on the organic material layer of the light transmitting area, the transmittance of the light transmitting area is increased to a certain extent.

Figure 23:
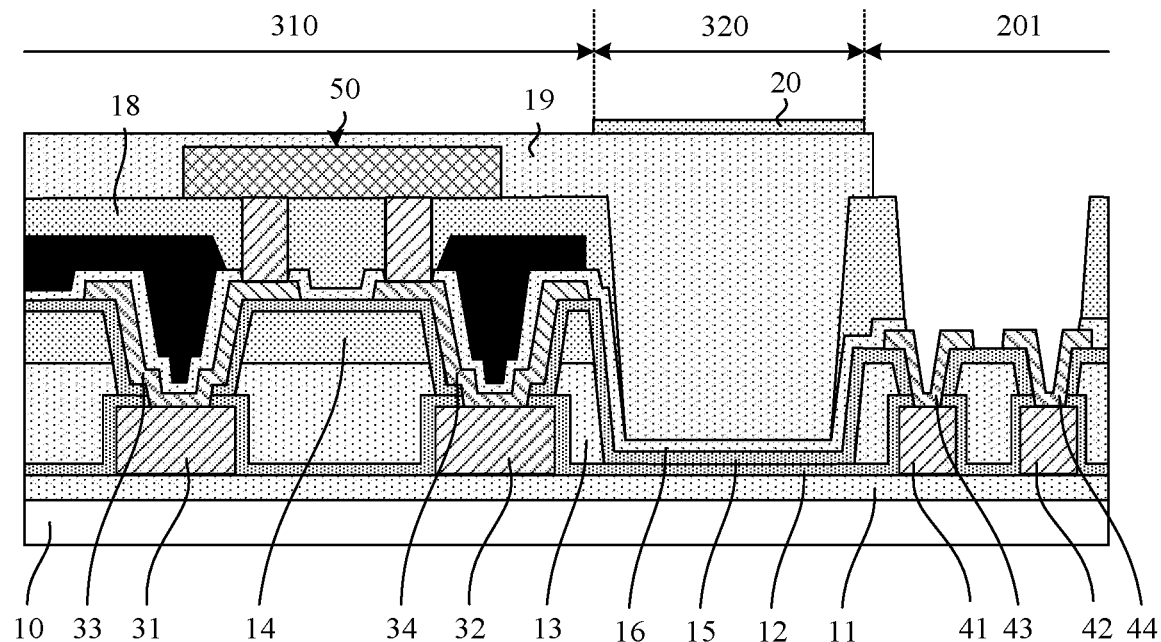
FIG. 23 is a schematic diagram of a sectional structure of still another display backplane according to an exemplary embodiment of the present disclosure.

FIG. 23 is a schematic diagram of a sectional structure of still another display backplane according to an exemplary embodiment of the present disclosure, illustrating sectional structures of a pixel area 310 and a light transmitting area 320 in a display area and a bonding pad area 201 in a bonding area 200. As shown in FIG. 23, in an exemplary implementation, the structures of the pixel structure layer, the light transmitting structure layer and the bonding structure layer of the display backplane may be substantially similar to those in the embodiment shown in FIG. 22, except for the provision of an antireflection layer 20 in the light transmitting area 320.

In an exemplary implementation, the antireflection layer 20 may be formed only in the light transmitting area 320, and the antireflection layer 20 is arranged on the protective layer 19 of the light transmitting area 320. The antireflection layer 20 is configured so that light that would otherwise be reflected passes through an antireflection film and then becomes coherent to cancel out, thereby allowing all light in the corresponding wavelengths to pass through the display backplane, achieving the effect of increasing the transmittance.

In an exemplary implementation, a material of the antireflection layer 20 may be magnesium fluoride $MgF_2$ or the like, and a thickness of the antireflection layer may be about 50 nm to 500 nm. For example, the thickness of the antireflection layer may be about 100 nm.

In an exemplary implementation, the preparation process of the display backplane according to an exemplary embodiment of the present disclosure may be substantially similar to the preparation process in the embodiment shown in FIG. 22, except that after the formation of the protective layer 19, an antireflection thin film is deposited, and the antireflection thin film is patterned by a patterning process to form a pattern of an antireflection layer 20.

In an exemplary implementation, optical simulations are performed for display backplanes without an antireflection layer and light transmitting holes, and with an antireflection layer and light transmitting holes on the organic material layer. The results of the optical simulations show that when the light transmitting area 320 is not provided with the light transmitting holes and the antireflection layer, the transmittance of the light transmitting area 320 is about 84.15%; and when the organic material layer of the light transmitting area 320 is provided with the light transmitting holes and the light transmitting area 320 is provided with the antireflection layer, the transmittance of the light transmitting area 320 is about 90.47%, with an increase of 6.32% and an improvement proportion of 7.51%. The thickness parameters of the various film layers are the same as those in the foregoing exemplary embodiments.

As can be seen from the structure and preparation flow of the display backplane described in the present exemplary embodiment, in the display backplane according to an exemplary embodiment of the present disclosure, by arranging an antireflection layer in the light transmitting area and light transmitting holes on the organic material layer, the transmittance of the light transmitting area is effectively increased, and the transmittance of the light transmitting area can reach 90.47%, thereby improving the overall transmittance of the display backplane, which can meet the requirement of transmittance in the application to common indoor scenes.

Figure 24:
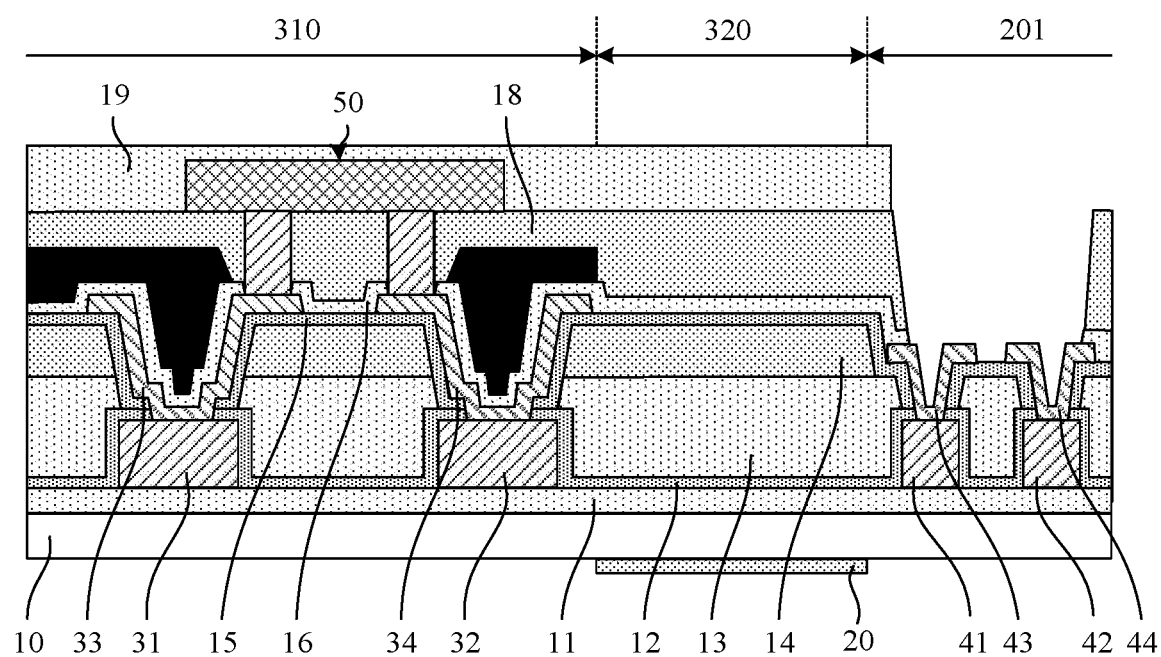
FIG. 24 is a schematic diagram of a sectional structure of still another display backplane according to an exemplary embodiment of the present disclosure.

FIG. 24 is a schematic diagram of a sectional structure of still another further display backplane according to an exemplary embodiment of the present disclosure, illustrating sectional structures of a pixel area 310 and a light transmitting area 320 in a display area and a bonding pad area 201 in a bonding area 200. As shown in FIG. 24, in an exemplary implementation, the structures of the pixel structure layer, the light transmitting structure layer and the bonding structure layer of the display backplane may be substantially similar to those in the embodiment shown in FIG. 3, except that an antireflection layer 20 may be arranged on a side of the substrate 10 away from the light transmitting structure layer.

In an exemplary implementation, the preparation process of the display backplane in an exemplary embodiment of the present disclosure may be substantially similar to the preparation process in the embodiment shown in FIG. 3, except that the antireflection layer 20 is formed on a side of the substrate 10 first, then the substrate 10 is turned over, and the pixel structure layer of the pixel area 310, the light transmitting structure layer of the light transmitting area 320 and the bonding structure layer of the bonding pad area 201 are prepared on the other side of the substrate 10 according to steps (11) to (17).

In an exemplary implementation, the antireflection layer 20 may be located in an area where the light transmitting area 320 is located.

In some possible exemplary implementations, the antireflection layer 20 of the present exemplary embodiment may be arranged on a side of the substrate away from the light transmitting structure layer in the structure shown in FIG. 20 and may be located in an area where the light transmitting area 320 is located. In some other possible exemplary implementations, the antireflection layer 20 of the present exemplary embodiment may be arranged on a side of the substrate away from the light transmitting structure layer in the structure shown in FIG. 22 and may be located in an area where the light transmitting area 320 is located. In some further possible exemplary implementations, the antireflection layer 20 of the present exemplary embodiment may be arranged on a side of the substrate with another structure away from the light transmitting structure layer and may be located in an area where the light transmitting area 320 is located, which is not limited here in the present disclosure.

In the display backplane according to an exemplary embodiment of the present disclosure, the transmittance of the light transmitting area may also be increased.

An exemplary embodiment of the present disclosure further provides a method for preparing a display backplane, which is used for preparing the display backplane in the aforementioned exemplary embodiment. The display backplane may include a plurality of display units, at least one display unit may include a pixel area and a light transmitting area, the pixel area is configured to perform image display, and the light transmitting area is configured to transmit light. In an exemplary implementation, the preparation method may include: forming a light transmitting structure layer on the substrate of the light transmitting area, the light transmitting structure layer being provided with light transmitting holes.

In an exemplary implementation, forming the light transmitting structure layer on the substrate of the light transmitting area includes: forming a light transmitting structure layer including an inorganic material layer and an organic material layer on the substrate of the light transmitting area, and the light transmitting holes provided on the light transmitting structure layer include any one or more of: a through hole penetrating the inorganic material layer and a through hole penetrating the organic material layer.

In an exemplary implementation, forming the light transmitting structure layer on the substrate of the light transmitting area includes: forming a buffer layer on the substrate, forming a first passivation layer on the buffer layer, forming a first planarization layer on the first passivation layer, forming a second planarization layer on the first planarization layer, forming a second passivation layer on the second planarization layer, forming a third passivation layer on the second passivation layer, and forming a third planarization layer on the third passivation layer; The light transmitting holes provided on the light transmitting structure layer include any one or more of: a through hole penetrating the buffer layer, a through hole penetrating the first passivation layer, a through hole penetrating the first planarization layer, a through hole penetrating the second planarization layer, a through hole penetrating the second passivation layer, a through hole penetrating the third passivation layer, and a through hole penetrating the third planarization layer.

The present disclosure further provides a display apparatus, including the display backplane in the aforementioned exemplary embodiment. The display apparatus may be any product or component with a display function, such as a mobile phone, a tablet computer, a television, a display, a laptop computer, a digital photo frame, or a navigator.

Although the implementations disclosed in the present disclosure are described as above, the described contents are only implementations which are used in order to facilitate understanding of the present disclosure, and are not intended to limit the present invention. Any skilled person in the art to which the present disclosure pertains may make any modifications and variations in forms and details of implementation without departing from the spirit and scope of the present disclosure. However, the patent protection scope of the present invention should be subject to the scope defined by the appended claims.

The invention claimed is:

1. A display backplane, comprising a plurality of display units, wherein:

at least one display unit comprises a pixel area and a light transmitting area, the pixel area is configured to perform image display and the light transmitting area is configured to transmit light; in a direction perpendicular to the display backplane, the light transmitting area comprises a substrate and a light transmitting structure layer arranged on the substrate, and the light transmitting structure layer is provided with light transmitting holes;

the light transmitting structure layer comprises: a buffer layer arranged on the substrate, a first passivation layer arranged on a side of the buffer layer away from the substrate, a first planarization layer arranged on a side of the first passivation layer away from the substrate, a second planarization layer arranged on a side of the first planarization layer away from the substrate, a second passivation layer arranged on a side of the second planarization layer away from the substrate, a third passivation layer arranged on a side of the second passivation layer away from the substrate, and a third planarization layer arranged on a side of the third passivation layer away from the substrate; and the light transmitting holes provided on the light transmitting structure layer comprise any one or more of: a through hole penetrating the buffer layer, a through hole penetrating the first passivation layer, a through hole penetrating the first planarization layer, a through hole penetrating the second planarization layer, a through hole penetrating the second passivation layer, a through hole penetrating the third passivation layer, and a through hole penetrating the third planarization layer; and the second passivation layer comprises a first passivation sublayer and a second passivation sublayer, the second passivation sublayer is arranged on a side of the first passivation sublayer away from the substrate, a material of the first passivation sublayer comprises silicon nitride, and a material of the second passivation sublayer comprises loose silicon nitride.

2. The display backplane according to claim 1, wherein the light transmitting structure layer comprises an inorganic material layer and an organic material layer, and the light transmitting holes provided on the light transmitting structure layer comprise any one or more of: a through hole penetrating the inorganic material layer and a through hole penetrating the organic material layer.

3. The display backplane according to claim 2, wherein the display backplane comprises a display area and a bonding area located on at least one side of the display area, the plurality of display units are located in the display area; in the direction perpendicular to the display backplane, the pixel area comprises the substrate and a pixel structure layer arranged on the substrate, the bonding area comprises the substrate and a bonding structure layer arranged on the substrate, the pixel structure layer and the bonding structure layer each comprise an inorganic material layer, a conductive layer and an organic material layer, and a thickness of the organic material layer in the bonding structure layer is smaller than a thickness of the organic material layer in the pixel structure layer.

4. The display backplane according to claim 1, wherein the light transmitting area further comprises a protective layer arranged on a side of the light transmitting structure layer away from the substrate, and the light transmitting holes are filled by the protective layer.

5. The display backplane according to claim 4, wherein the light transmitting area further comprises an antireflection layer arranged on a side of the protective layer away from the substrate.

6. The display backplane according to claim 5, wherein a material of the antireflection layer comprises magnesium fluoride.

7. The display backplane according to claim 5, wherein a thickness of the antireflection layer is 50 nm to 500 nm.

8. The display backplane according to claim 5, wherein the display backplane comprises a display area and a bonding area located on at least one side of the display area, the plurality of display units are located in the display area; in the direction perpendicular to the display backplane, the pixel area comprises the substrate and a pixel structure layer arranged on the substrate, the bonding area comprises the substrate and a bonding structure layer arranged on the substrate, the pixel structure layer and the bonding structure layer each comprise an inorganic material layer, a conductive layer and an organic material layer, and a thickness of the organic material layer in the bonding structure layer is smaller than a thickness of the organic material layer in the pixel structure layer.

9. The display backplane according to claim 4, wherein the display backplane comprises a display area and a bonding area located on at least one side of the display area, the plurality of display units are located in the display area; in the direction perpendicular to the display backplane, the pixel area comprises the substrate and a pixel structure layer arranged on the substrate, the bonding area comprises the substrate and a bonding structure layer arranged on the substrate, the pixel structure layer and the bonding structure layer each comprise an inorganic material layer, a conductive layer and an organic material layer, and a thickness of the organic material layer in the bonding structure layer is smaller than a thickness of the organic material layer in the pixel structure layer.

10. The display backplane according to claim 1, wherein the light transmitting area further comprises an antireflection layer arranged on a side of the substrate away from the light transmitting structure layer.

11. The display backplane according to claim 1, wherein the display backplane comprises a display area and a bonding area located on at least one side of the display area, the plurality of display units are located in the display area; in the direction perpendicular to the display backplane, the pixel area comprises the substrate and a pixel structure layer arranged on the substrate, the bonding area comprises the substrate and a bonding structure layer arranged on the substrate, the pixel structure layer and the bonding structure layer each comprise an inorganic material layer, a conductive layer and an organic material layer, and a thickness of the organic material layer in the bonding structure layer is smaller than a thickness of the organic material layer in the pixel structure layer.

12. The display backplane according to claim 11, wherein the pixel structure layer at least comprises: a buffer layer arranged on the substrate, a first conductive layer arranged on a side of the buffer layer away from the substrate and comprising a first electrode and a second electrode, a first passivation layer arranged on a side of the first conductive layer away from the substrate, a first planarization layer arranged on a side of the first passivation layer away from the substrate, a second planarization layer arranged on a side of the first planarization layer away from the substrate, a second passivation layer arranged on a side of the second planarization layer away from the substrate, and a second conductive layer arranged on a side of the second passivation layer away from the substrate and comprising a positive connection terminal and a negative connection terminal; and the bonding structure layer at least comprises: a buffer layer arranged on the substrate, a first conductive layer arranged on a side of the buffer layer away from the substrate and comprising a first bonding electrode and a second bonding electrode, a first passivation layer arranged on a side of the first conductive layer away from the substrate, a first planarization layer arranged on a side of the first passivation layer away from the substrate, a second passivation layer arranged on a side of the first planarization layer away from the substrate, and a second conductive layer arranged on a side of the second passivation layer away from the substrate and comprising a first bonding terminal and a second bonding terminal.

13. A display apparatus, comprising the display backplane according to claim 1.

14. A method for preparing a display backplane, the display backplane comprising a plurality of display units, at least one display unit comprising a pixel area and a light transmitting area, the pixel area being configured to perform image display and the light transmitting area being configured to transmit light; the method comprising:

forming a light transmitting structure layer on a substrate of the light transmitting area, the light transmitting structure layer being provided with light transmitting holes, wherein forming the light transmitting structure layer on the substrate of the light transmitting area comprises: forming a buffer layer on the substrate, forming a first passivation layer on the buffer layer, forming a first planarization layer on the first passivation layer, forming a second planarization layer on the first planarization layer, forming a second passivation layer on the second planarization layer, forming a third passivation layer on the second passivation layer, and forming a third planarization layer on the third passivation layer;

wherein the light transmitting holes provided on the light transmitting structure layer comprise any one or more of: a through hole penetrating the buffer layer, a through hole penetrating the first passivation layer, a through hole penetrating the first planarization layer, a through hole penetrating the second planarization layer, a through hole penetrating the second passivation layer, a through hole penetrating the third passivation layer, and a through hole penetrating the third planarization layer; and wherein the second passivation layer comprises a first passivation sublayer and a second passivation sublayer, the second passivation sublayer is arranged on a side of the first passivation sublayer away from the substrate, a material of the first passivation sublayer comprises silicon nitride, and a material of the second passivation sublayer comprises loose silicon nitride.

15. The method according to claim 14, wherein forming the light transmitting structure layer on the substrate of the light transmitting area comprises: forming the light transmitting structure layer comprising an inorganic material layer and an organic material layer on the substrate of the light transmitting area; and the light transmitting holes provided on the light transmitting structure layer comprise any one or more of: a through hole penetrating the inorganic material layer and a through hole penetrating the organic material layer.

* * * * *